(12) United States Patent  
Stanton

(10) Patent No.: US 6,372,639 B1  
(45) Date of Patent: Apr. 16, 2002

(54) METHOD FOR CONSTRUCTING INTERCONNECTS FOR SUB-MICRON SEMICONDUCTOR DEVICES AND THE RESULTING SEMICONDUCTOR DEVICES

(75) Inventor: William Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/576,836

(22) Filed: May 23, 2000

Related U.S. Application Data

(62) Division of application No. 09/386,305, filed on Aug. 31, 1999.

(51) Int. Cl.$^7$ ................................................ H02L 82/42
(52) U.S. Cl. .................. 438/648; 257/296; 257/905; 257/906; 257/908; 118/724; 438/238; 438/239; 438/250; 438/253; 438/393; 438/396
(58) Field of Search ................. 257/296, 905, 257/906, 908; 118/724; 438/238, 239, 250, 253, 393, 396, 648

(56) References Cited

U.S. PATENT DOCUMENTS

| 5,248,633 A | | 9/1993 | Morar et al. |
| 5,514,884 A | * | 5/1996 | Hively et al. ............. 257/203 |
| 5,686,345 A | | 11/1997 | Harmon et al. |
| 5,731,619 A | | 3/1998 | Subbanna |
| 5,800,626 A | | 9/1998 | Cohen et al. |
| 5,811,849 A | | 9/1998 | Matsuura |
| 5,814,885 A | | 9/1998 | Pogge et al. |
| 5,923,062 A | | 7/1999 | Ohno |
| 5,953,609 A | * | 9/1999 | Koyama et al. ............. 438/253 |

* cited by examiner

Primary Examiner—Charles Bowers
Assistant Examiner—Lisa Kilday
(74) Attorney, Agent, or Firm—Dickstein Shapiro Morin & Oshinsky, LLP

(57) ABSTRACT

A workpiece and method are provided for forming N polysilicon interconnects coupled to N contact openings in a semiconductor device. The workpiece includes an active area and N potential contact openings covered with a dielectric layer, a first through hole etched in the dielectric layer to expose substantially all of the workpiece corresponding to the active area to thereby expose the N contact openings, a monolithic polysilicon plug deposited in the first through hole, and N−1 second through holes etched in the polysilicon plug and disposed between the N contact openings to thereby divide the polysilicon plug into the N polysilicon interconnects, where N is an integer greater than or equal to 2. According to one aspect of the invention, the workpiece includes N−1 conductors traversing the active area, the N contact openings are disposed adjacent to the N−1 conductors, and each of the N contact openings is separated from the other contact openings by one of the N−1 conductors.

35 Claims, 17 Drawing Sheets

METHOD FOR CONSTRUCTING INTERCONNECTS FOR SUB-MICRON SEMICONDUCTOR DEVICES AND THE RESULTING SEMICONDUCTOR DEVICES

This application is a divisional of application Ser. No. 09/386,305 filed on Aug. 31, 19999, which is hereby incorporated by reference.

BACKGROUND OF THE INVENTION

1. The Field of the Invention

The present invention relates to processes for constructing conductive interconnects. More specifically, the present invention relates to processes for constructing a plurality of conductive interconnects on sub-micron semiconductor devices.

2. The Relevant Technology

Integrated circuits are manufactured by an elaborate process in which a variety of different microelectronic devices are integrally formed on a semiconductor substrate such as a silicon wafer or a silicon-on-insulator (SOI) structure. In advanced manufacturing of integrated circuits, hundreds of thousands of electronic devices can be formed on a single substrate.

One of the steps in the fabrication of integrated circuits is to form generally horizontal conducting, e.g., metallic, interconnection or wire lines between the discrete microelectronic devices on the integrated circuit and to external circuitry. The horizontal interconnections are conducting layers that permit an electrical current to be delivered to and from the various microelectronic devices so that the integrated circuit can perform its intended function. Since the integrated circuitry needed for a semiconductor is usually build-up three-dimensionally on the substrate in order to increase the packing density and so forth, multilevel metallizations or conductors are generally necessary and employed. It will be appreciated that this necessitates the provision of inter-level dielectric layers interposed between different conductor levels formed on the device substrate.

Vias, also referred to as "vertical interconnects" or simply "interconnects," are used to electrically connect different horizontal levels of metallization or conductors. The interconnect is a via hole or through hole filled with a conductor material that extends through a dielectric interposed between surfaces of two separate horizontal conductor levels. It will be appreciated that the layering process is repeated as needed to form additional levels and to form a plurality of similar horizontal and vertical conductive interconnections. Among other things, the yield, performance and reliability of the semiconductor device depend to a large extent on the accuracy of placement of the through hole with respect to the active regions of the individual semiconductor devices.

U.S. Pat. No. 5,869,403, which patent is incorporated herein by reference for all purposes, discloses formation of contact openings over a substrate in which an interconnect, e.g., a conducting polysilicon plug can be formed. Since many layers of material overlie the substrate, forming a desired contact opening necessarily involves etching through different overlying layers of material.

Referring to FIGS. 1–3, a semiconductor wafer fragment is shown generally at 10. Fragment 10 includes a top surface 12 atop which two laterally spaced apart conductive lines 14 are formed. Lines 14 comprise respective polysilicon layers 16, silicide layers 18, and insulative nitride caps 20, all of which having been formed by a previous anisotropic etch. Lines 14 also include insulative sidewall spacers 22. It will also be appreciated that the lines 14 can be fabricated over a thin oxide layer 23. However, since such details are well known to one of ordinary skill in the art, and since the presence or absence of such well known structure has no impact on either the art discussed in this section or the invention discussed below, fine details are omitted unless critical to understanding the present invention. It should also be noted that conductive lines 14 may form gates of transistor structures and that doped regions may be present in the silicon substrate 15 on either side of conductive line 14. A thin oxide layer 24 is typically formed over the substrate and conductive lines 14, and typically is composed of an oxide formed from decomposition of tetraethyloxysilane (TEOS). A layer 26 of borophosphosilicate glass (BPSG) is typically formed over layer 24 as shown.

FIG. 2 illustrate one possible problem associated with forming a contact opening to wafer or substrate 10, wherein a contact opening 28 is anisotropically etched between conductive lines 14 to a degree sufficient to expose an area 30 of the substrate between the conductive lines and to which electrical connection is to be made. As the conductive lines 14 are pushed closer together, etching to surface 30 may also produce destructive etching of one or more layers associated with conductive lines 14. It will be appreciated that this problem occurs more often as the device density increases. Typical etch chemistries for etching contact opening 28 etch BPSG layer 26 at a much faster rate than TEOS layer 24. Accordingly, when the anisotropic etch reaches TEOS layer 24 between contact lines 14 (FIG. 1), the etch must be conducted for a longer period of time to thereby ensure that TEOS layer 24 is completely removed to adequately expose area 30. This etch, due in part to the differing etch rates between TEOS layer 24 and BPSG layer 26, can overetch the inner-most side wall spacers 22 and erode nitride cap 20 thereby undesirably exposing silicide 18 as shown for the right-most conductive line 14 in FIG. 2. The resulting condition can, and does, cause shorting between adjacent lines or devices when a polysilicon plug is formed in the etched area, thereby rendering the device useless.

FIG. 3 illustrates one proposed solution to the above-described problem, wherein contact opening 28 is made to be narrower between conductive lines 14. As shown, the sides of contact opening 28 coincide with inner-most side wall spacers 22 so that the risk of overetching the side wall spacers and hence nitride caps 20 and silicide 18 is reduced. However, limiting the contact opening width, with the reduced risk of overetching, places severe constraints on the photomask and the alignment processes used to define contact opening 28. It also produces a high aspect ratio (height to width of the etched area) which is harder to later fill with a conductor.

Another semiconductor wafer fragment is indicated generally by reference numeral 32 in FIG. 4, which is provided to illustrate an alternative method of producing interconnect vias. The fragment 32 includes a substrate 34 having a top surface 36. A pair of conductive lines 38 are formed atop surface 36 and over substrate 34 by patterning and etching respective layers of polysilicon 40, silicide 42 and nitride 44. Nitride layers 44 form protective caps over the conductive lines. Sidewall spacers 46, preferably also formed from nitride, are formed over conductive lines 38 and together with nitride caps 44 form a protective encapsulating layer. Conductive lines 38 constitute a pair of nitride insulated conductive lines between which electrical connection to substrate 34 is to be made. It will be noted that lines 38 are formed adjacent a substrate contact area 48 with which the electrical connection will be made.

A first oxide layer 50 is formed over substrate 34 and between conductive lines 38 covering at least part and preferably all of contact area 48. In the illustrated and preferred example, layer 50 is an undoped oxide layer which is formed or deposited by decomposition of TEOS to a thickness of from about 300–500 Angstroms. A second oxide layer 52 is formed over first oxide layer 50 and is preferably formed from a different oxide material than layer 50. It should be noted that second oxide layer 52 comprises a doped oxide layer of BPSG, which is formed or deposited over first layer 50 to a thickness of about 10,000–14,000 Angstroms. Thus, first oxide layer 50 is interposed between the substrate and second oxide layer 52, i.e., directly beneath the second oxide layer.

FIG. 4 broadly illustrates the resultant semiconductor wafer fragment following a semiconductor processing method wherein a first oxide layer 50 is formed over the substrate to cover at least part of the contact area and a second oxide layer 52 is formed over the first oxide layer, the first and second oxide layers being different from one another. A first etch is then conducted over the contact area and through the second oxide layer to a degree sufficient to leave at least a portion of the first oxide layer over the contact area, i.e., the area denotes as $w_2$, in FIG. 4. A second etch is then conducted to a degree sufficient to remove substantially all of the first oxide layer left behind and to remove a desired amount of the second oxide layer laterally outwardly of the contact area, i.e., the area denoted as $w_2$ in FIG. 4. As mentioned above, the first oxide layer can be TEOS while the second oxide layer can be BPSG. BPSG in the vicinity of the contact opening is removed by a conventional anisotropic etch. TEOS and residual BPSG is removed by an isotropic etch using an aqueous solution comprising fluorine and having less than or equal to about 10% by weight of an etch rate changing surfactant which etches the second oxide layer at a slower rate than the first oxide layer. In short, the second etch minimizes the overetching problems illustrated in FIG. 2.

The processing method of controllably widening a contact opening by exposing the opening to an aqueous solution comprising fluorine, and having an added surfactant, after first anisotropically etching the contact opening, described in connection with FIG. 4, has several advantages over the processes described with respect to FIG. 2 or FIG. 3. First, the initial anisotropic dry etch does not have to be conducted for as long a period of time in an attempt to clear all of the oxide from the bottom of the contact area 48, which results in reducing or virtually eliminating the risk of over etching inner-most side wall spacers 46 and causing undesirable shorts as mentioned above. Any remaining oxide will be etched by the subsequently conducted wet etch which selectively etches the preferred TEOS and BPSG layers 50, 52 respectively, relative to nitride side wall spacers 46 and nitride caps 44, as illustrated in FIG. 4. Additionally, the above-described method reduces the risk of damaging the substrate surface adjacent contact area 48 because such area will be cleared by the subsequently conducted wet etch. Such wet etch is much less destructive to the silicon surface than the previously conducted anisotropic dry etch.

From the discussion of FIGS. 1–4 above, it will be appreciated that the proposed solutions to the overetching problems require initial formation of through holes which are smaller that the polysilicon plug that is to be formed over the contact opening. In many cases, the initial width of the through holes may be less than that of either of the conductive lines 38. It will be appreciated that this increases the precision needed for mask design and alignment during the various processing steps. It will also be appreciated that the requisite precision increases geometrically as semiconductor technology migrates from 0.25 micron to 0.18 micron to 0.13 micron processes.

What is needed is a process for forming a plurality of interconnects wherein each step of the process permits one dimensional control of the masking or printing process. Moreover, what is needed is a process for forming interconnects wherein each mask includes features which are greater than or equal to one line width. It would be highly desirable if the process for forming multiple interconnects could employ masks based on masks employed in fabricating conducting lines, e.g., wordlines, and active regions of the semiconductor device.

SUMMARY OF THE INVENTION

Based on the above and foregoing, it can be appreciated that there presently exists a need in the pertinent art which mitigates the above-described deficiencies.

In one aspect, the present invention provides a process for forming N polysilicon interconnects in a semiconductor device, where N is a positive integer greater than or equal to two. Preferably, the process includes steps for depositing a monolithic polysilicon plug covering N contact openings, and etching N−1 through holes in the polysilicon plug to thereby separate the polysilicon plug into N polysilicon interconnects.

In another aspect, the present invention provides a process for forming a plurality of polysilicon interconnects associated with a respective plurality of contact openings in a semiconductor device, comprising steps of providing a workpiece having an active area and a plurality of potential contact openings covered with a dielectric layer, etching a first through hole in the dielectric layer to expose the plurality of contact openings, depositing a polysilicon plug in the first through hole, and etching at least one second through hole in the polysilicon plug to thereby divide the polysilicon plug into the polysilicon interconnects.

In another aspect, the present invention provides a semiconductor processing method for forming N polysilicon interconnects coupled to N contact openings in a semiconductor device. The semiconductor processing method advantageously includes steps for providing a workpiece having an active area and N potential contact openings covered with a dielectric layer, etching a first through hole in the dielectric layer to expose substantially all of the workpiece corresponding to the active area to thereby expose the N contact openings, depositing a monolithic polysilicon plug in the first through hole, and etching N−1 second through holes in the polysilicon plug and disposed between the N contact openings to thereby divide the polysilicon plug into the N polysilicon interconnects, where N is an integer greater than or equal to 2. According to one aspect of the inventive processing method, the workpiece includes N−1 conductors traversing the active area, the N contact openings are disposed adjacent to the N−1 conductors, and each of the N contact openings is separated from the other contact openings by one of the N−1 conductors. In an exemplary case, the conductors are wordlines in a memory device.

In another aspect, the present invention provides a semiconductor processing method for forming N polysilicon interconnects coupled to N contact openings in a semiconductor device, including steps for providing a workpiece having an active area and N potential contact openings covered with first and second dielectric layers, etching a first hole in the first dielectric layer over substantially all of the workpiece corresponding to the active area using a first etch process, etching a first through hole in the first and second dielectric layers to expose substantially all of the workpiece corresponding to the active area to thereby expose the N contact openings using a second etch process, depositing a monolithic polysilicon plug in the first through hole, and etching, using a third etch process, N−1 second through holes in the polysilicon plug and disposed between the N contact openings to thereby divide the polysilicon plug into the N polysilicon interconnects, where N is an integer greater than or equal to 2.

In another aspect, the present invention provides a semiconductor processing method for forming M×N polysilicon interconnects coupled to M×N contact openings in a semiconductor array including at least M discrete devices. Preferably, the processing method includes steps of providing a workpiece having M active areas, each active area having N potential contact openings covered with first and second dielectric layers, etching M first holes in the first dielectric layer over substantially all of the workpiece corresponding to the M active areas using a first etch process, etching M first through holes in the first and second dielectric layers to expose substantially all of the workpiece corresponding to the M active areas to thereby expose the M×N contact openings using a second etch process, depositing a monolithic polysilicon plug in the M first through holes to thereby form M polysilicon plugs, and etching, using a third etch process, M×(N−1) second through holes in the M polysilicon plugs to thereby divide the M polysilicon plugs into the M×N polysilicon interconnects. In an exemplary case, N is an integer greater than or equal to 2 and M is an integer orders of magnitude greater than N.

In another aspect, the present invention provides a semiconductor processing method for forming N polysilicon interconnects coupled to N contact openings in a semiconductor device, comprising steps for providing a workpiece having an active area and N potential contact openings covered with a dielectric layer, etching a first through hole having first and second dimensions in the dielectric layer to expose substantially all of the workpiece corresponding to the active area to thereby expose the N contact openings, depositing a monolithic polysilicon plug in the first through hole, and etching N−1 second through holes, each having third and fourth dimensions in the polysilicon plug and disposed between the N contact openings to thereby divide the polysilicon plug into the N polysilicon interconnects. In one exemplary embodiment of the present invention, N is an integer greater than or equal to 2, the first dimension is greater than the second dimension, the second dimension of the first through hole is aligned with the short axis of the active area, the third dimension is greater than the fourth dimension, and the fourth dimension of each of the N−1 second through holes is aligned with a predetermined portion of the active area perpendicular to the long axis of the active area.

In another aspect, the present invention provides a semiconductor processing method for forming N polysilicon interconnects coupled to N contact openings in a semiconductor device, which method includes steps for providing a workpiece having an active area and N potential contact openings covered with first and second dielectric layers, etching a first hole having first and second dimensions in the first dielectric layer over substantially all of the workpiece corresponding to the active area using a first etch process, etching a first through hole have the first and the second dimensions in the second dielectric layer to expose substantially all of the workpiece corresponding to the active area to thereby expose the N contact openings using a second etch process, depositing a monolithic polysilicon plug in the first through hole, and etching, using a third etch process, N−1 second through holes, each having third and fourth dimensions, in the polysilicon plug and disposed between the N contact openings to thereby divide the polysilicon plug into the N polysilicon interconnects. In one exemplary embodiment, N is an integer greater than or equal to 2, the first dimension is greater than the second dimension, the second dimension of the first through hole is aligned with the short axis of the active area, the third dimension is greater than the fourth dimension, and the fourth dimension of each of the N−1 second through holes is aligned with a predetermined portion of the active area perpendicular to the long axis of the active area.

In another aspect, the present invention provides a semiconductor processing method for forming a pair of memory cells connected to a common digitline, wherein an active area corresponding to the memory cells includes 3 contact openings permitting connection of first and second storage capacitors and the common digitline via 3 polysilicon interconnects coupled to 3 contact openings in a semiconductor device. In one exemplary embodiment, the method includes steps for providing a workpiece having an active area and 3 potential contact openings covered with a dielectric layer, etching a first through hole in the dielectric layer to expose substantially all of the workpiece corresponding to the active area to thereby expose the 3 contact openings, depositing a monolithic polysilicon plug in the first through hole, and etching 2 second through holes in the polysilicon plug and disposed between the 3 contact openings to thereby divide the polysilicon plug into the 3 polysilicon interconnects.

In another aspect, the present invention provides a semiconductor processing method for forming a pair of memory cells connected to a common digitline, wherein an active area corresponding to the memory cells includes 3 contact openings permitting connection of first and second storage capacitors and the common digitline via 3 polysilicon interconnects coupled to 3 contact openings, wherein the inventive method includes steps for providing a workpiece having an active area and 3 potential contact openings covered with first and second dielectric layers, etching a first hole in the first dielectric layer over substantially all of the workpiece corresponding to the active area using a first etch process, etching a first through hole in the first and second dielectric layers to expose substantially all of the workpiece corresponding to the active area to thereby expose the 3 contact openings using a second etch process, depositing a monolithic polysilicon plug in the first through hole, and etching, using a third etch process, 2 second through holes in the polysilicon plug and disposed between the 3 contact openings to thereby divide the polysilicon plug into the 3 polysilicon interconnects.

In another aspect, the present invention provides a semiconductor processing method for forming a memory cell array of M elements, each element of the array including a pair of memory cells connected to a common digitline, wherein an active area corresponding to each pair of memory cells includes 3 contact openings permitting connection of first and second storage capacitors and the common digitline via 3 polysilicon interconnects coupled to 3 contact openings to thereby forming 3M polysilicon interconnects coupled to 3M contact openings. Preferably, the semiconductor proceeding method includes steps for providing a workpiece having M active areas, each active area having 3 potential contact openings covered with first and second dielectric layers, etching M first holes in the first dielectric layer over substantially all of the workpiece corresponding to the M active areas using a first etch process, etching M first through holes in the first and second dielectric layers to expose substantially all of the workpiece corresponding to the M active areas to thereby expose the 3M contact openings using a second etch process, depositing a monolithic polysilicon plug in the M first through holes to thereby form M polysilicon plugs, and etching, using a third etch process, 2M second through holes in the M polysilicon plugs to thereby divide the M polysilicon plugs into the 3M polysilicon interconnects. In an exemplary case, M is an integer greater than 1000, although M advantageously can be several orders of magnitude larger than 1000.

In another aspect, the present invention provides a memory device including a memory chip comprising a memory circuit fabricated on the memory chip. Preferably, the memory circuit includes an active area, N elements disposed above the active and separated from the active area by at least one dielectric layer, and N vertical polysilicon interconnects electrically connecting N contact openings associated with the active area with the N elements. Most preferably, the polysilicon interconnects are formed by the process of providing a workpiece having the active area and N potential contact openings covered with the dielectric layer, etching a first through hole in the dielectric layer to expose substantially all of the workpiece corresponding to the active area to thereby expose the N contact openings, depositing a monolithic polysilicon plug in the first through hole, and etching N–1 second through holes in the polysilicon plug and disposed between the N contact openings to thereby divide the polysilicon plug into the N polysilicon interconnects, where N is an integer greater than or equal to 2.

In another aspect, the present invention provides a memory module, comprising a die substrate comprising a circuit board, a plurality of memory chips mounted on the circuit board, wherein one or more of the memory chips comprise a memory circuit fabricated on the semiconductor chip for communicating with a processor, where the memory circuit advantageously includes an active area, N elements disposed above the active and separated from the active area by at least one dielectric layer, and N vertical polysilicon interconnects electrically connecting N contact openings associated with the active area with the N elements. According to one aspect of the invention, the N polysilicon interconnects are formed by the process of providing a workpiece having the active area and N potential contact openings covered with the dielectric layer, etching a first through hole in the dielectric layer to expose substantially all of the workpiece corresponding to the active area to thereby expose the N contact openings, depositing a monolithic polysilicon plug in the first through hole, and etching N–1 second through holes in the polysilicon plug and disposed between the N contact openings to thereby divide the polysilicon plug into the N polysilicon interconnects, where N is an integer greater than or equal to 2.

In another aspect, the present invention provides a processor system, which includes a processor, and memory circuit fabricated on a semiconductor chip communicating with the processor. Preferably, the memory circuit includes an active area, N elements disposed above the active area and separated from the active area by at least one dielectric layer, and N vertical polysilicon interconnects electrically connecting N contact openings associated with the active area with the N elements. Most preferably, the N polysilicon interconnects are formed by the process of providing a workpiece having the active area and N potential contact openings covered with the dielectric layer, etching a first through hole in the dielectric layer to expose substantially all of the workpiece corresponding to the active area to thereby expose the N contact openings, depositing a monolithic polysilicon plug in the first through hole, and etching N–1 second through holes in the polysilicon plug and disposed between the N contact openings to thereby divide the polysilicon plug into the N polysilicon interconnects, where N is an integer greater than or equal to 2.

The invention simplifies the alignment process of fabricating a conductor down to a desired surface of an integrated circuit device.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which.

DETAILED DESCRIPTION OF THE PREFERRED EMBODIMENTS

Illustrative embodiments and exemplary applications will now be described with reference to the accompanying drawings to disclose the advantageous teachings of the present invention.

In the context of this document, "contact opening" is intended to include any opening in a layer, including but not limited to openings formed within insulating or other layers and within which capacitors are formed. In the context of this document, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure including, but not limited, to the semiconductive substrates described above.

Figure 5:
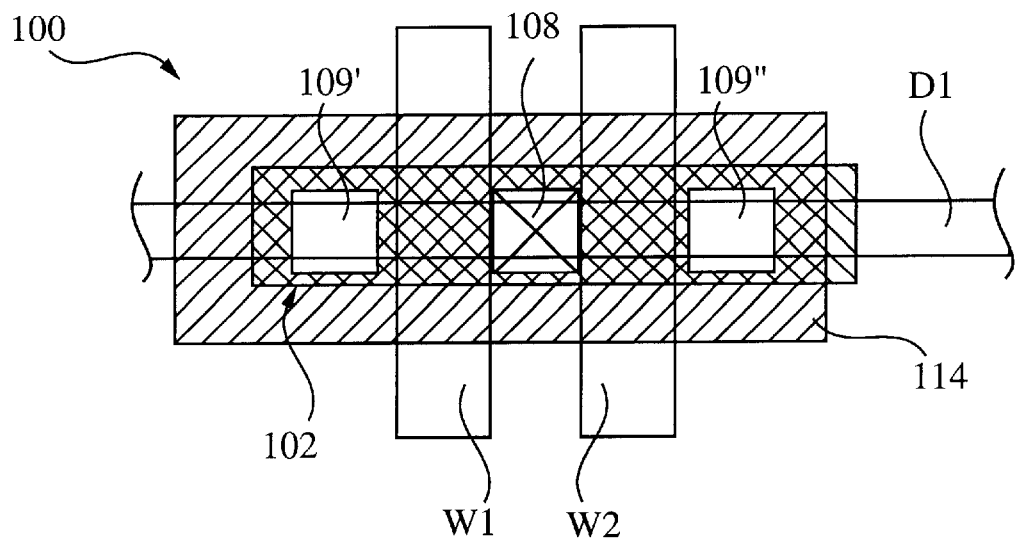
FIG. 5 depicts a top view of a conventional semiconductor wafer fragment.
Figure 6:
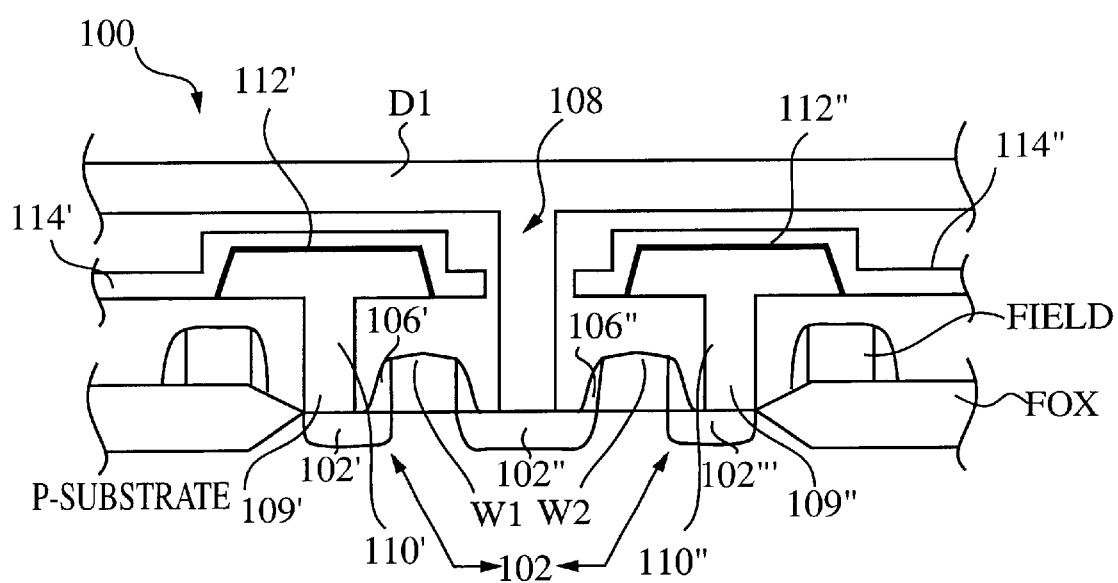
FIG. 6 depicts a side sectional view of the conventional semiconductor wafer fragment illustrated in FIG. 5.

FIG. 5 is a top view of a semiconductor wafer fragment 100 on which is to be formed a mbit pair, i.e., a pair of memory cells, while FIG. 6 is sectional view of the semiconductor wafer fragment 100 illustrating selected layers of the mbit pair of a buried capacitor cell structure. The semiconductor wafer fragment 100 preferably includes an active area generally denoted 102, which advantageously can be formed from several discrete doped regions 102', 102", and 102'" formed in a substrate 104, as illustrated in FIG. 6. Above the active area 102 is disposed a pair of wordlines W1 and W2, which can be employed in selectively activating one mbit in the mbit pair. Preferably, each wordline W1, W2 is formed from a conductor, e.g., polysilicon or metal layer over an oxide layer, covered by nitride spacers 106' and 106", as discussed in greater detail below. As noted previously, well known details regarding exact construction of the wordlines W1, W2, etc., are omitted, since such details do not facilitate an understanding of the present invention and play no part in it. The active area 102, i.e., the areas 102', 102", and 102'", is connected via three contact openings to a digitline contact 108 and a pair of polysilicon interconnects 109', 109" coupling the active areas 102' and 102'" with storage nodes 110' and 110", e.g. capacitors. Each of the storage nodes 110' and 110" is covered with a layer 112', 112", respectively, of oxide-nitride-oxide (ONO) dielectric and a polysilicon cellplate 114', 114". The digitline contact 108 connects to a digitline D1.

Figure 7:
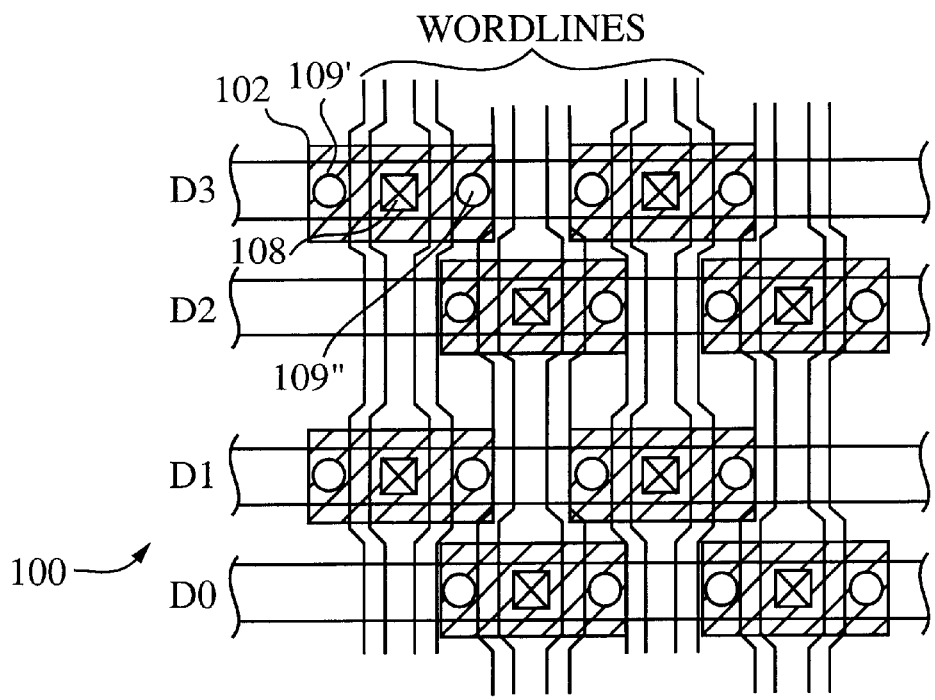
FIG. 7 illustrates a conventional memory array formed on a semiconductor wafer fragment.
Figure 8:
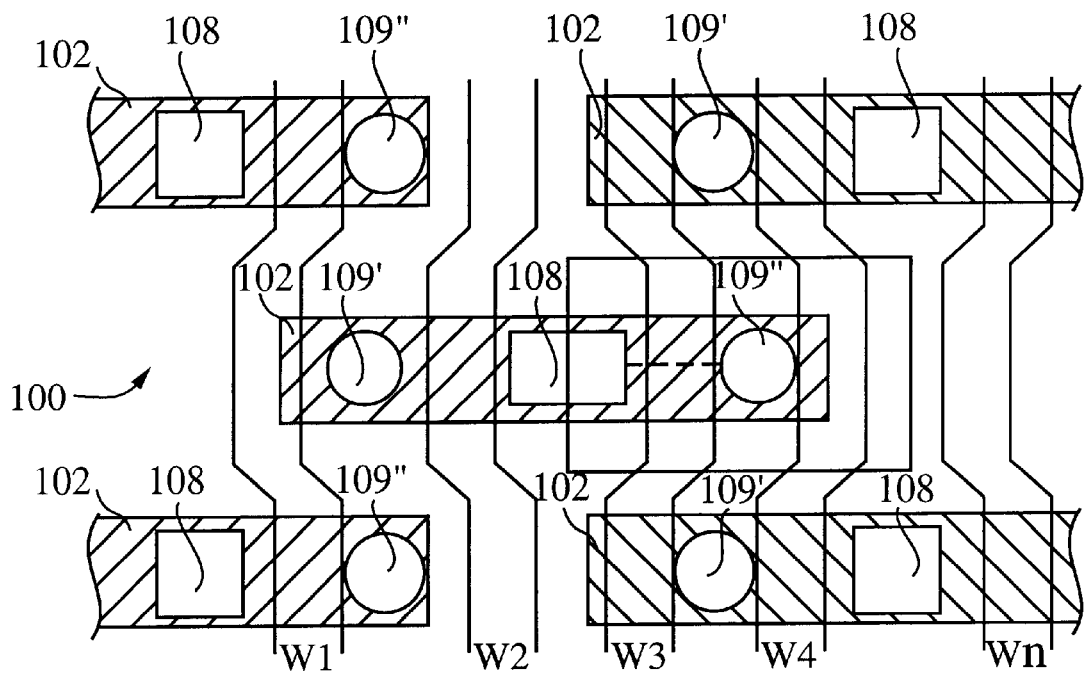
FIG. 8 illustrates the active regions and wordlines on a selected portion of the semiconductor wafer fragment depicted in FIG. 7.

FIG. 7 depicts an array of mbit pairs formed on the semiconductor wafer fragment 100 while FIG. 8 is an expanded view of selected layers of several mbit pairs in order to highlight the active region and the wordlines W1, . . . , Wn formed on the active regions 102, for reasons which will become clear in the discussion which follows. It will be appreciated from FIGS. 7 and 8 that the wordlines are arranged to maximize the density of the mbit pairs on the semiconductor wafer.

Figure 9:
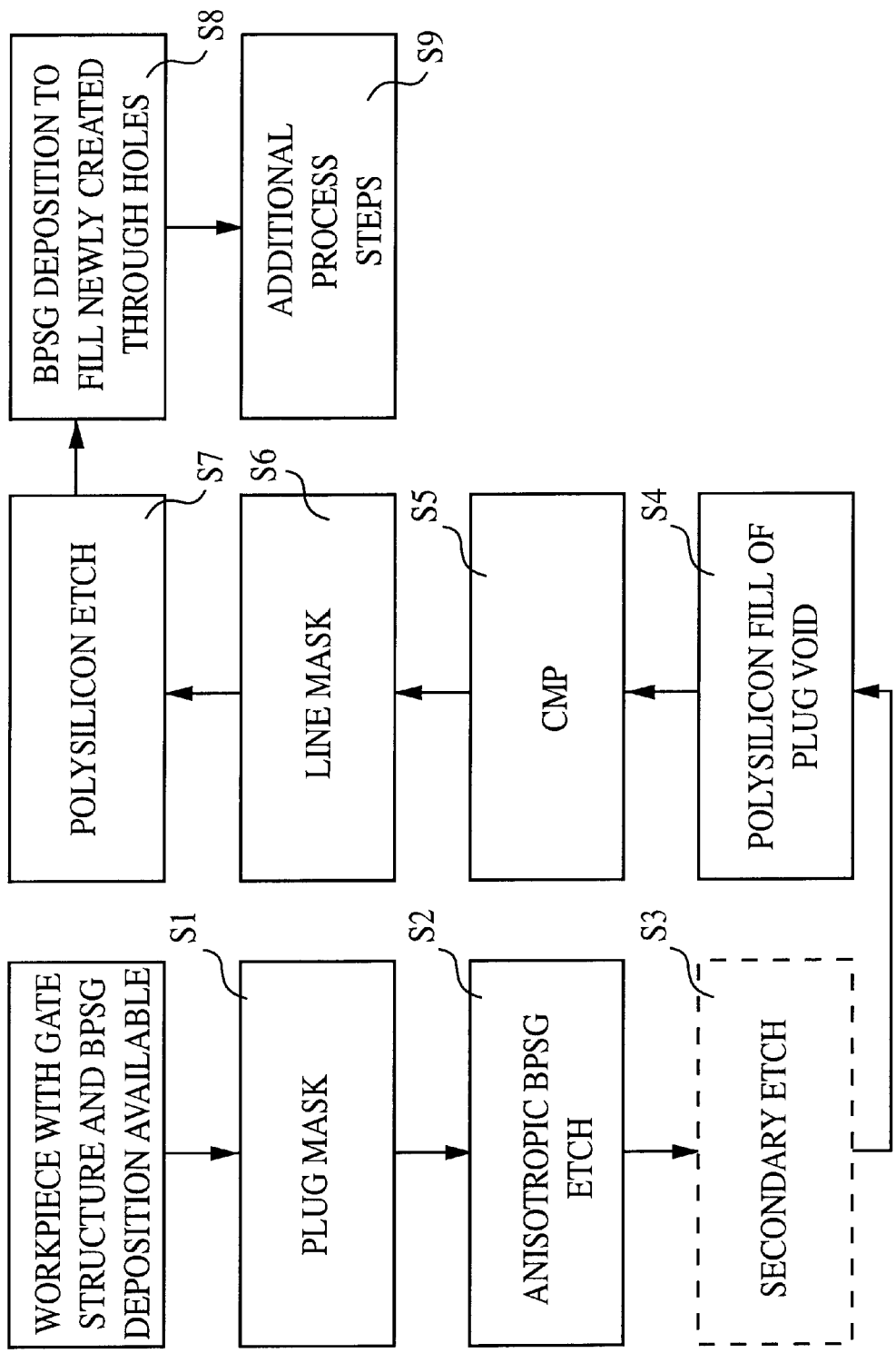
FIG. 9 is a flow diagram illustrating a process flow for producing a plurality of polysilicon plugs or interconnects in a semiconductor device according to the present invention.
Figure 10A:
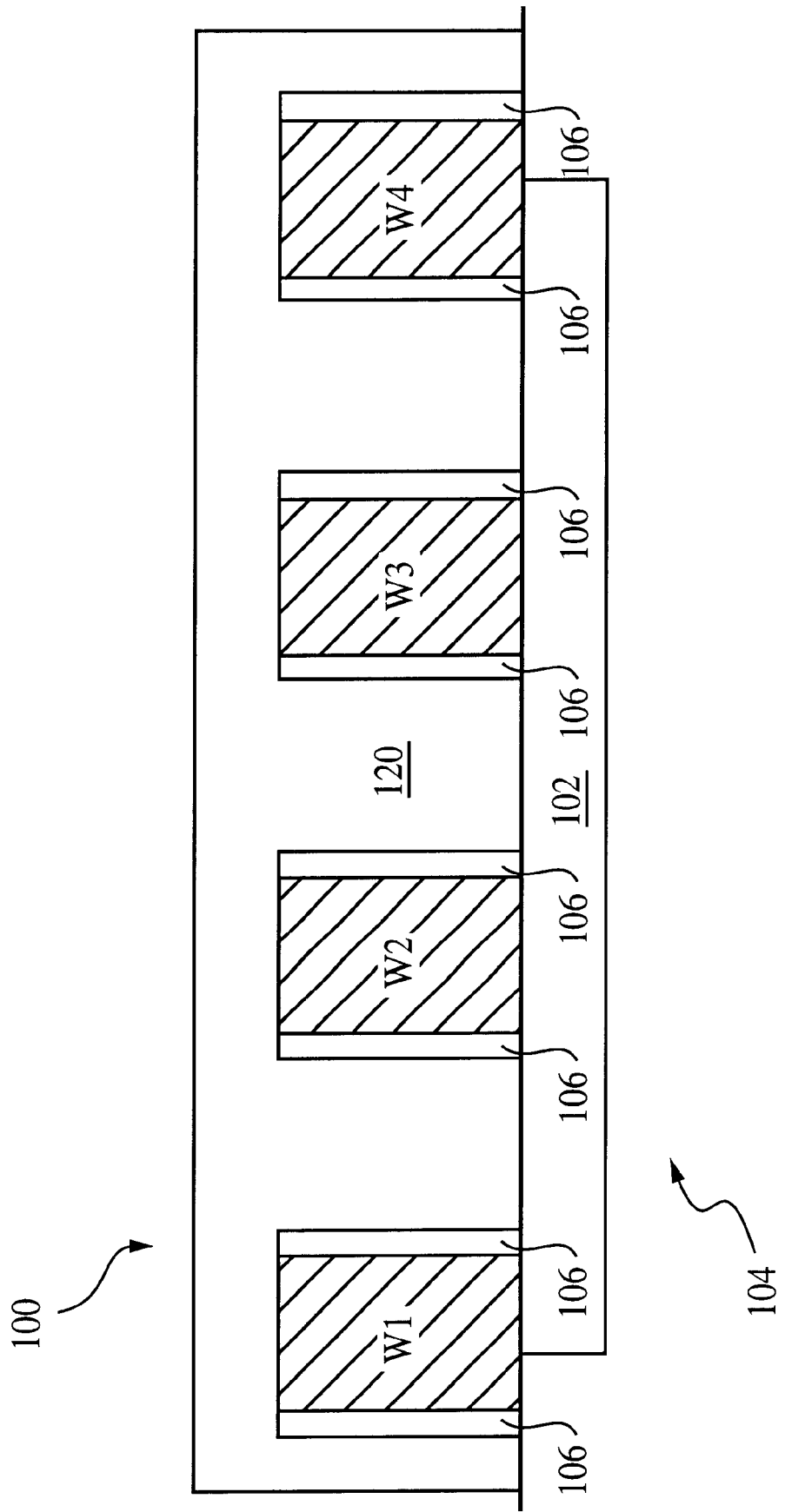
FIGS. 10A and 10B depict alternative forms of a semiconductor wafer fragment workpiece on which a plurality of polysilicon plugs are to be formed.
Figure 10B:
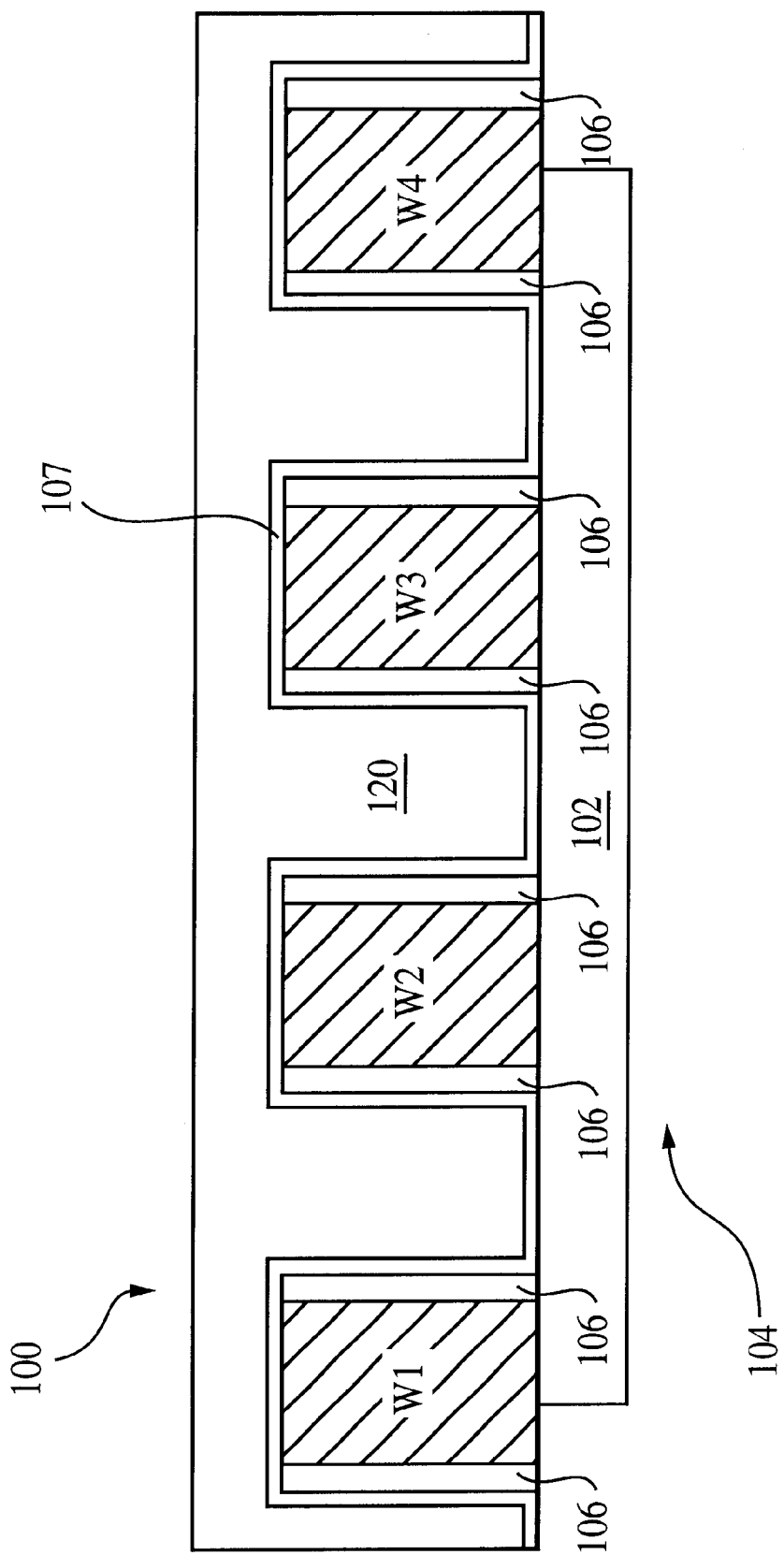
Figure 11A:
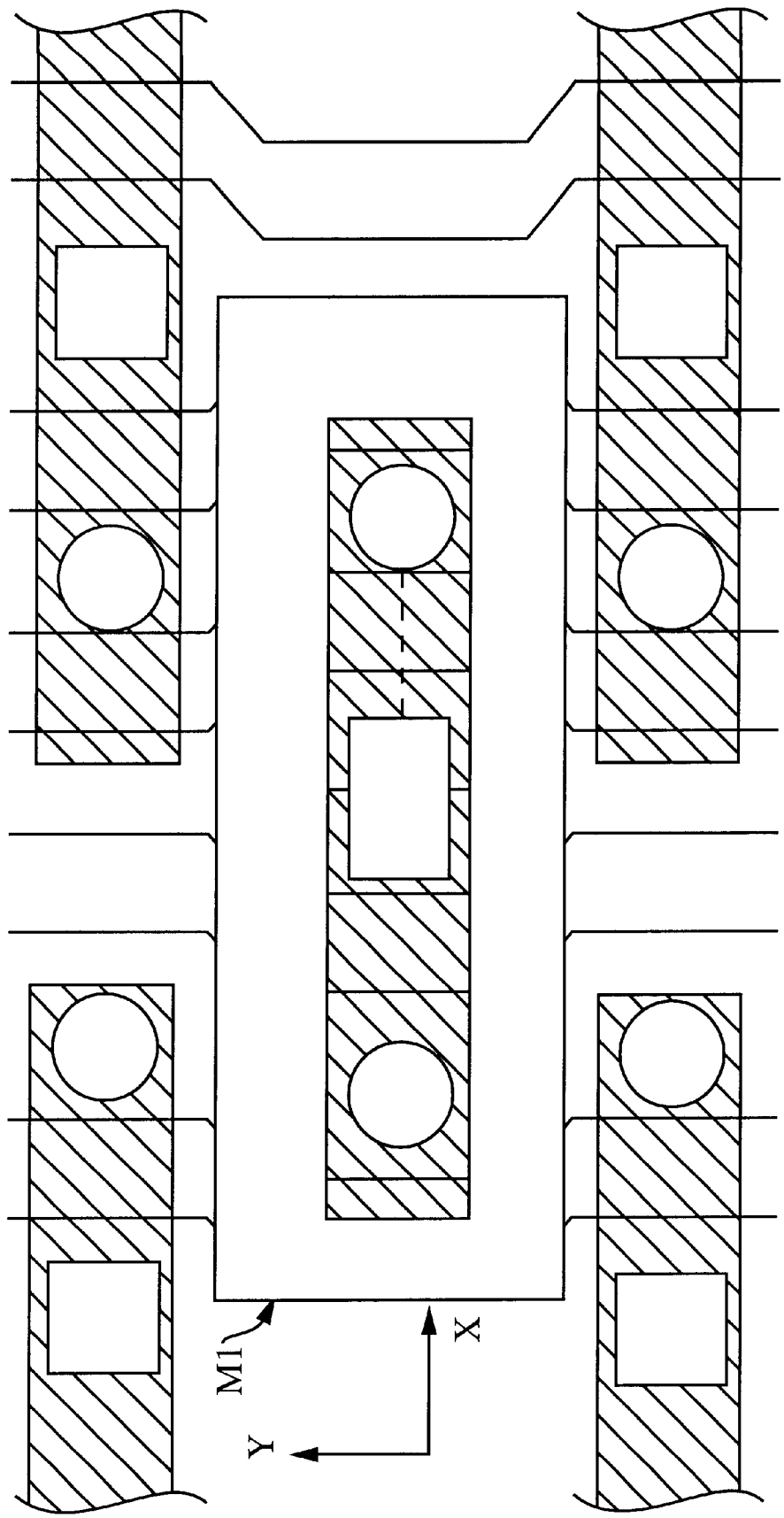
FIGS. 11A and 11B illustrate first and second masks employed in the process flow illustrated in FIG. 9.
Figure 11B:
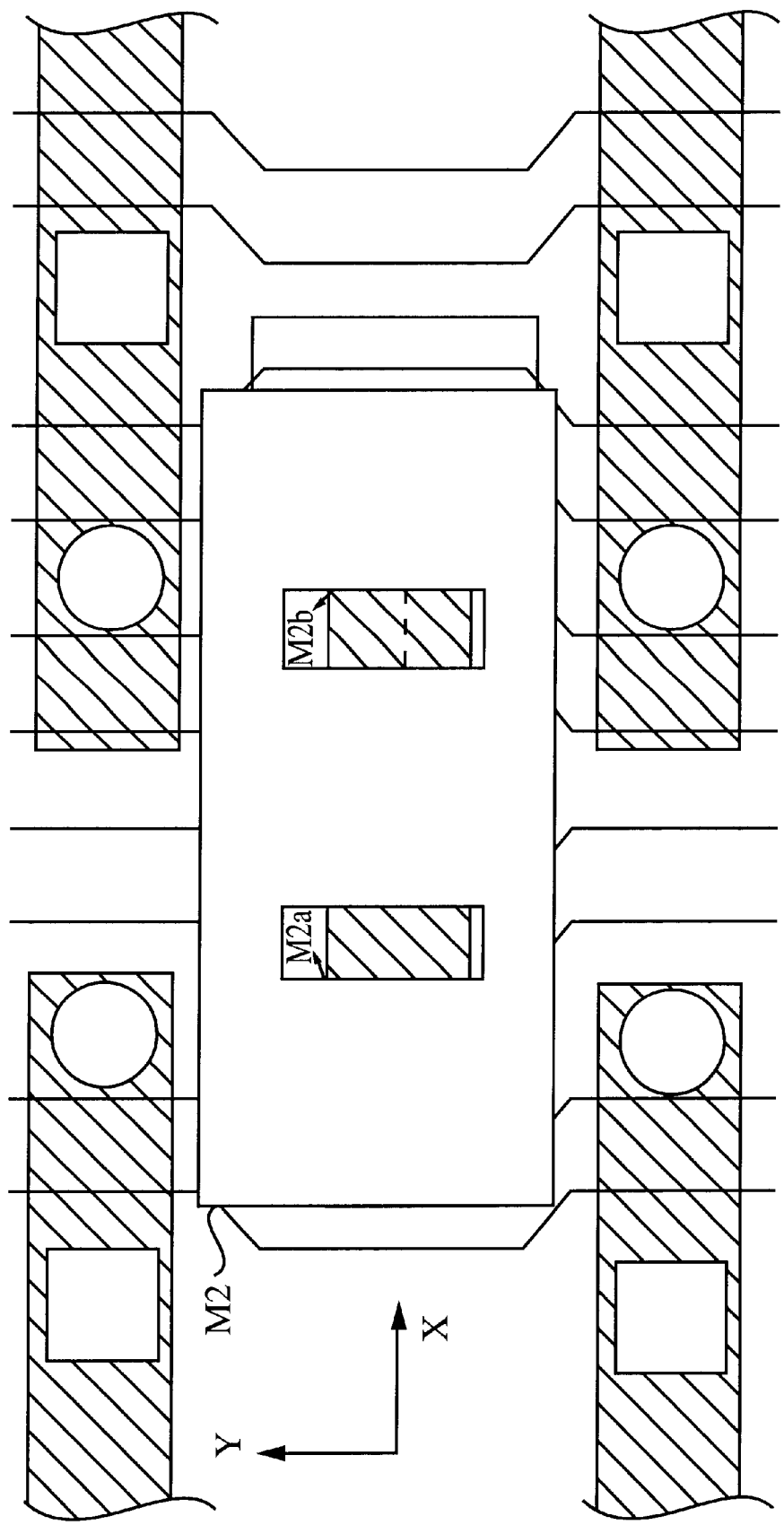
Figure 12:
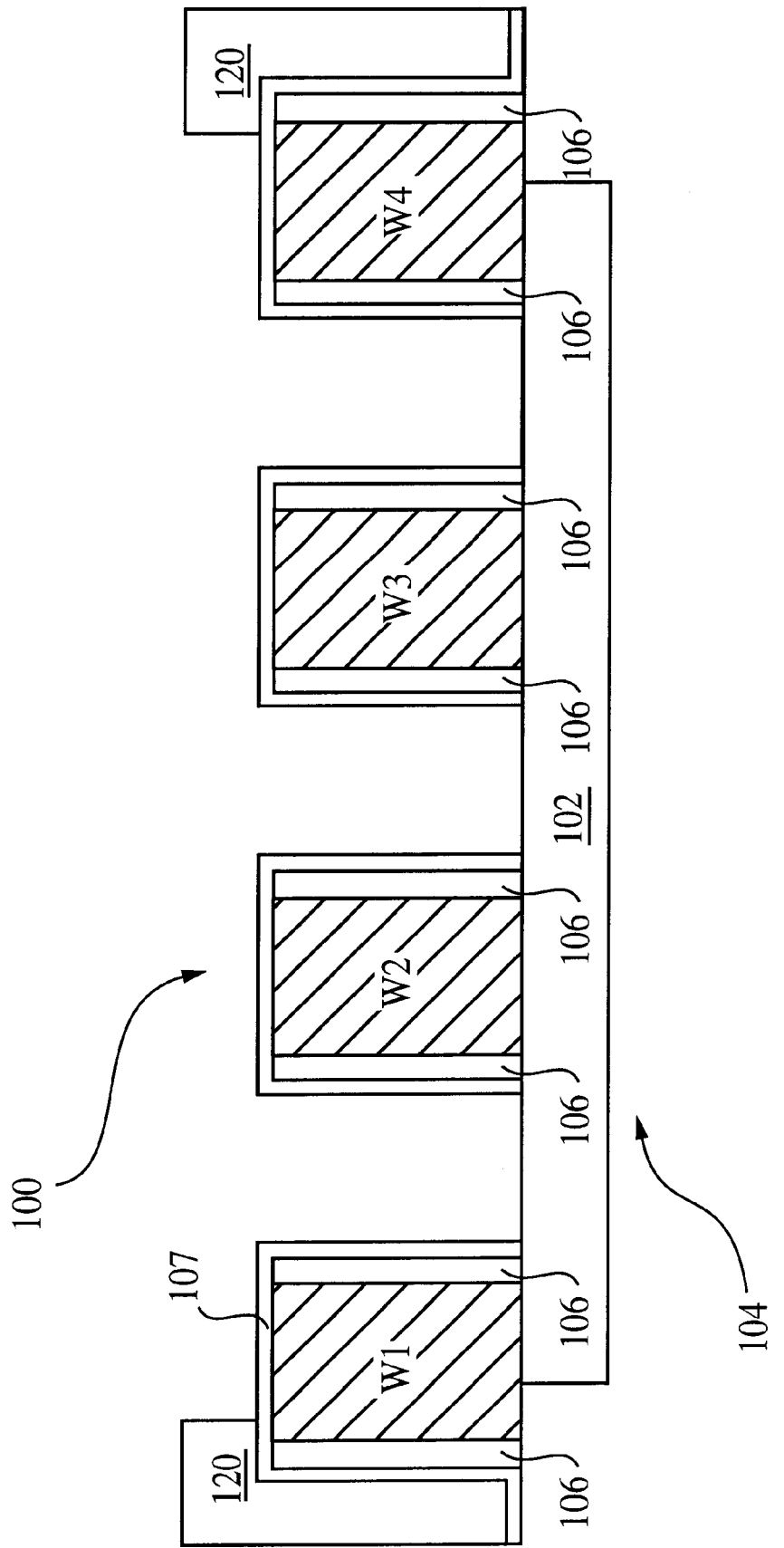
FIG. 12 illustrates the semiconductor wafer fragment workpiece after a first process step has been performed.
Figure 13:
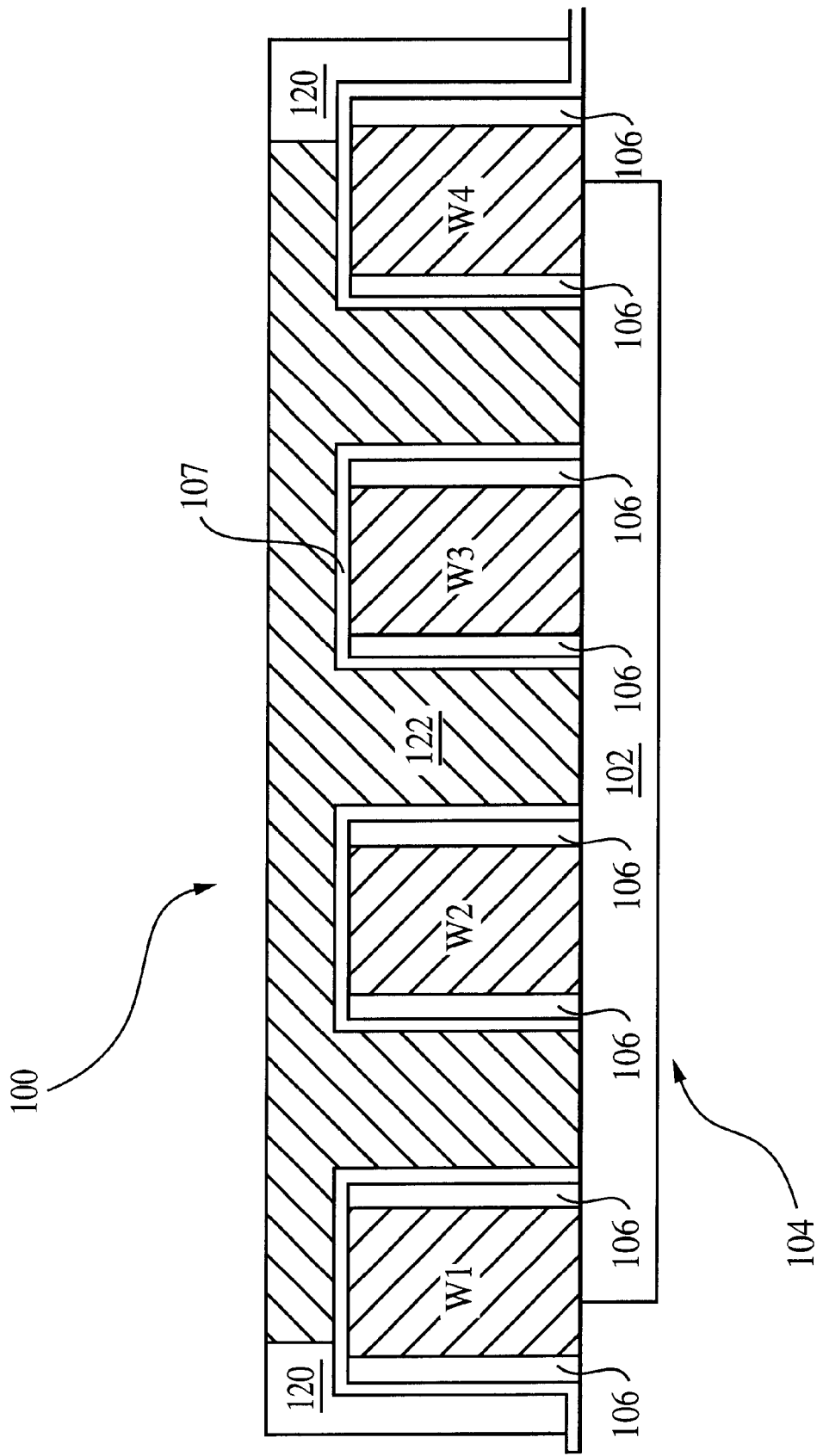
FIG. 13 illustrates the semiconductor wafer fragment workpiece after a second process step has been performed.
Figure 14:
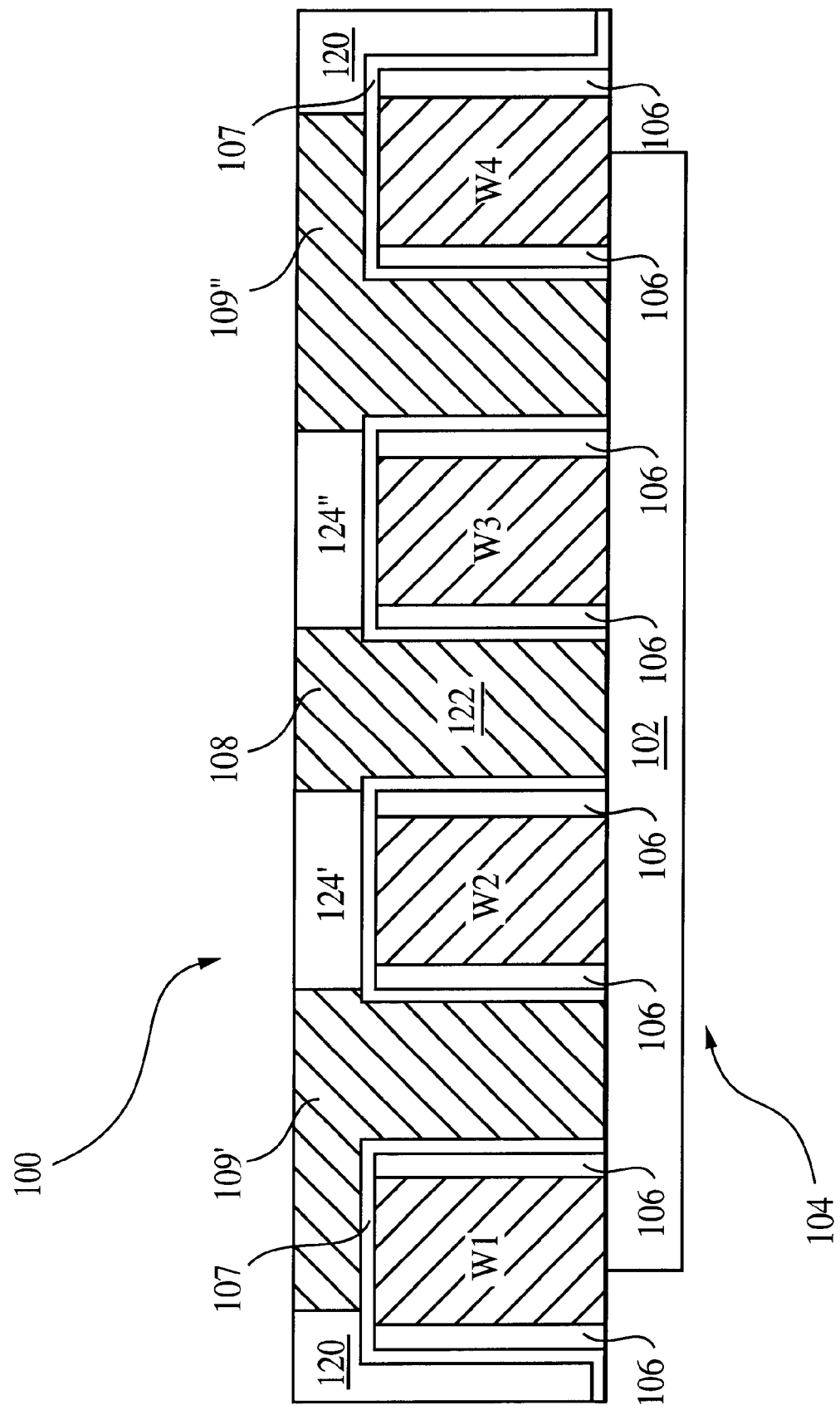
FIG. 14 illustrates the semiconductor wafer fragment workpiece after a third process step has been performed.

The method according to one preferred embodiment will now be described while referring to FIGS. 9 through 14, where FIG. 9 illustrates the process flow according to the present invention and FIGS. 10A and 10B illustrate fragments of the semiconductor wafer workpiece. FIGS. 11A and 11B illustrate fragments of the plug and line masks employed in the an exemplary embodiment of the method according to the present invention. Finally, FIGS. 12–14 illustrate the semiconductor wafer fragment at various stages of the process depicted in FIG. 9.

Prior to initiating the process flow, the workpiece preferably constructed according to either FIG. 10A or FIG. 10B is provided. It will be appreciated that one difference between the workpieces depicted in FIGS. 10A and 10B is the presence of an additional layer 107 in the workpiece of FIG. 10B. Advantageously, the layer 107 can be a nitride layer, although the layer also could be a layer formed by the decomposition of tetraethyloxysaline (TEOS). It will be appreciated that the exact construction of the workpiece will have no discernable impact on formation of the plurality of interconnects in accordance with the inventive method, the workpiece construction will dictate the process flow required to form contact opening down to the active layer of the semiconductor device. Accordingly, FIGS. 10A and 10B as well as FIGS. 12–14 illustrate a representative structure with which the invention may be used. It will be appreciated by those skilled in the art that many functional components may be integrated into an actual integrated circuit structure such as transistors, wordlines, capacitors, etc. in many different ways, FIG. 6 being just one example. These details are omitted from the ensuing description to simplify the understanding of the invention. Only the conductive lines, e.g., wordline W1, W2, W3 and W4 are illustrated.

As discussed above, FIGS. 12–14 illustrate the semiconductor wafer fragment 100 at various stages of the process flow identified in FIG. 9. As noted, the wordlines are exemplary only, since the actual construction of the wordlines and indeed the entire integrated circuit structure advantageously can be varied to suit the intended application of the semiconductor device without departing from the teaching or scope of the present invention. It should also be mention that each wordline preferably includes nitride wall spacers 106. In FIGS. 12–14, numeral 102 generally denoted the active region of the substrate 104 illustrated in greater detail in FIG. 6, while 120 denotes a BPSG layer, 122 denotes the polysilicon plug, and 124', 124" denote secondary through holes (vias) in the polysilicon plug 122.

Referring back to FIG. 9, during step S1, a plug mask in the form of a patterned photoresist layer is produced using standard photolithography techniques. It will be appreciated that the resist layer is patterned to shield those areas in which no polysilicon plugs are to be formed. It should be mentioned at this point that the plug mask advantageously can be the inverse, i.e., the photo negative, of the mask employed in fabricating the active area of the memory cell, i.e., mbit, pair illustrated in FIG. 8. Thus, the plug mask employed in step S1 is suitable for forming a single large polysilicon plug connected to the contact openings adjacent to the active wordlines W1 and W2 for the respective memory cell pair. See FIG. 11A, wherein one cell M1 of the mask pattern is shown overlaid on the semiconductor wafer fragment illustrated in FIG. 8. It will be appreciated that this opening in the pattern mask is repeated for each memory cell pair of the memory cell array depicted in FIG. 7.

It should be mentioned at this point that the placement or printing of the mask in step S1 is critical with respect to only one dimension. For example, it will be appreciated from FIG. 11A that mask placement in the "Y" direction is critical to interconnect plug formation while variations in the "X"

direction will have substantially no impact on the quality of the interconnect plugs formed in accordance with the process flow of the inventive method. Stated another way, the critical axis with respect to mask placement in step S1 is the short axis of the pattern opening.

During step S2, an anisotropic etch of the BPSG layer 120 through mask M1 advantageously is performed to remove the BPSG covering the contact openings of each respective mbit pair. Preferably, the etch is an anisotropic dry etch which is conducted through BPSG layer 120 to remove substantially all of the BPSG material over the contact opening. Exemplary conditions for such an etch in an Applied Materials 5000 reactor are 45 mTorr, 900 W, 40 Gauss, 20 scam $CF_4$, 45 sccm $CHF_3$, 80 sccm Ar, 9000 mTorr He backside pressure. It will be appreciated that this etch advantageously could be conducted as a second part of a 2-step etch, where the first etches oxide at a faster rate. Exemplary conditions in such instance for the first etch in the same reactor are 120 mTorr, 900 W, 90 Gauss, 20 sccm $CF_4$, 50 scam $CHF_3$, 110 sccm Ar, 28 sccm $N_2$, 9000 mTorr He backside pressure. The second etch, if performed, is performed during step S3.

In step S3, a secondary etch advantageously can be performed in the event that the workpiece has the optional layer 107 illustrated in FIG. 10B. It will be appreciated that step S3 is optional, since the workpiece having the exemplary form of FIG. 10A need not be subjected to additional processing to remove the material, e.g., residual BPSG and TEOS or residual BPSG and nitride, covering the contact openings adjacent to the active wordlines W1 and W2.

Figure 1:
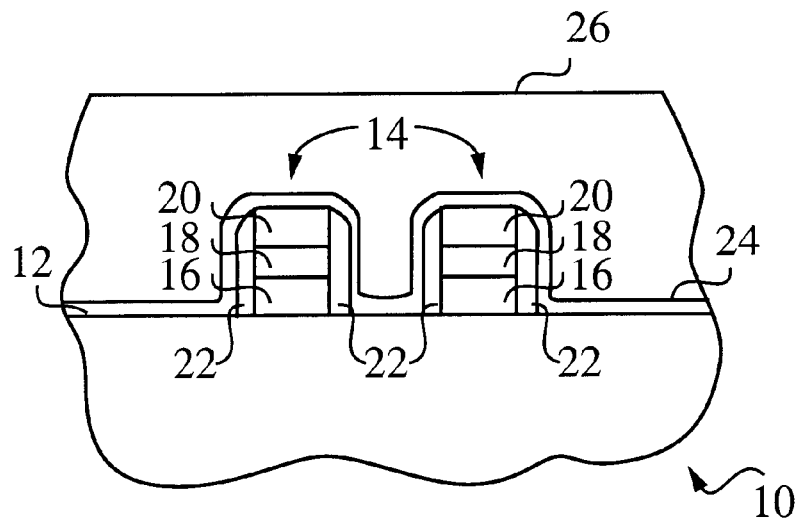
FIG. 1 is a diagrammatic sectional view of a conventional semiconductor wafer fragment illustrating the initial structure prior to performing the contact opening processing.
Figure 2:
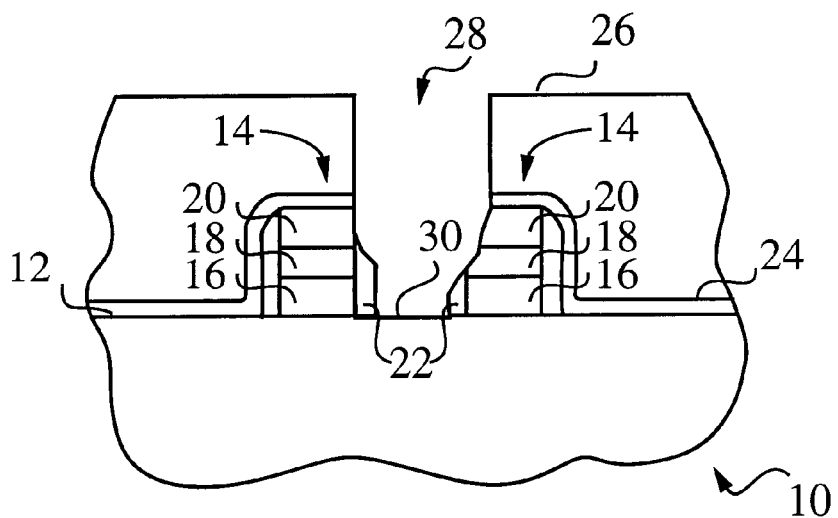
FIG. 2 is a view of the conventional semiconductor wafer fragment of FIG. 1 subsequent to performing an etch process that degrades the semiconductor device.
Figure 3:
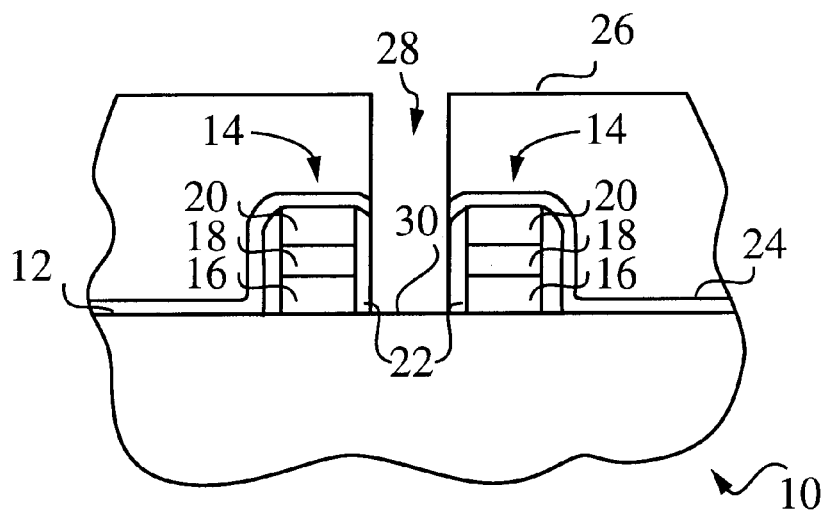
FIG. 3 is a view of the conventional semiconductor wafer fragment of FIG. 1 subsequent to performing an alternative etch process calculated to avoid the-defect illustrated in FIG. 2.
Figure 4:
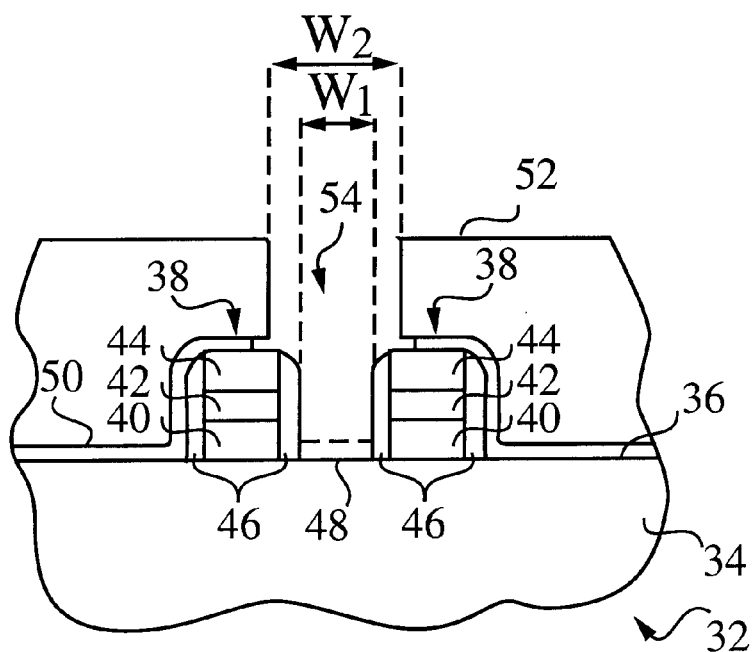
FIG. 4 is a view of the conventional semiconductor wafer fragment of FIG. 1 subsequent to performing a two step etch process calculated to avoid the defect illustrated in FIG. 2.

In the event that a secondary layer 107 of TEOS is to be removed, the secondary etch can be conducted using a suitable aqueous solution comprising fluorine atoms, e.g., an aqueous 0.5% by weight HF solution, and $NH_4F$ solution or a mixture thereof It should be mentioned that such solutions have a greater etch rate for BPSG layer 120 than for TEOS layer 107. A typical etch rate ratio for such a solution as between BPSG layer 120 and layer 107 is about 3:1. Accordingly, etch timing is controlled to avoid overetching BPSG layer 120 and the nitride encapsulated conductive lines, e.g., active wordlines W1 and W2. In an alternative embodiment, the secondary etch comprises an isotropic wet etch using an aqueous solution comprising fluorine atoms and having less than or equal to about 10% by weight of a surfactant which changes the rate of etching as between the preferred BPSG and TEOS layers 52, 50 respectively. Such enables BPSG layer 52 to be etched at a slower rate than TEOS layer 50 which, accordingly, reduces if not eliminates any risk of overetch of the BPSG layer. Additional details regarding the etch process of step S2 can be found in U.S. Pat. No. 5,869,403, which, as mentioned above, is incorporated herein by reference. See the discussion of FIG. 4, above. In the event that layer 107 is a nitride layer, the nitride layer advantageously can be removed by employing an anisotropic etch, as disclosed in U.S. Pat. No. 5,858,865. It should be mentioned that this patent is also incorporated herein by reference for all purposes. The resultant structure produced by step S2 (and optional step S3) that is, after etching, is illustrated in FIG. 12.

During step S4, doped polysilicon is deposited upon the wafer surface to fill the areas left open by the BPSG (and nitride) etch(es). In other words, the space previously occupied by the removed layers, e.g., the removed BPSG layer 120 and layer 107, is filled with polysilicon 122. The polysilicon 122 re-filled area is shown in FIG. 13. Then, during step S5, the polysilicon 122 on the wafer surface is gradually removed from the top downward by chemical mechanical polishing ("CMP"), or dry etch-back, to leave a unitary poly plug straddling the active wordlines W1 and W2.

During step S6, a second, "line" mask in the form of a patterned photoresist layer is produced using standard photolithography techniques. One cell M2 of the line mask, which includes openings M2a and M2b, is illustrated in FIG. 11B. It will be appreciated that the resist layer is patterned to shield those areas in which no polysilicon material included in the monolithic polysilicon plugs is to be removed. It should be mentioned at this point that the line mask advantageously can be similar to the mask employed in fabricating the active wordlines W1 and W2 of the memory cell, i.e., mbit, pair illustrated in FIG. 8. Thus, the plug mask employed in step S6 is suitable for defining several sections of the single large, i.e., monolithic, polysilicon plug connected to the contact openings adjacent to the active wordlines W1 and W2 of the respective memory cell pair for removal. FIG. 11B, shows one cell M2 of the mask pattern overlaid on the semiconductor wafer fragment illustrated in FIG. 8. It will be appreciated that the openings M2a and M2b in the pattern mask are repeated for each memory cell pair of the memory cell array depicted in FIG. 7.

It should be mentioned at this point that the placement or printing of the mask in step S6 is critical with respect to only one dimension. For example, it will be appreciated from FIG. 11b that mask placement in the "X" direction is critical to interconnect plug formation while variations in the "Y" direction will have substantially no impact on the quality of the interconnect plugs formed in accordance with the process flow of the inventive method. Stated another way, the critical axis with respect to mask placement in step S6 is the short axis of the pattern opening.

During step S7, the monolithic polysilicon plug is etched to form a plurality of through holes 124' and 124", which separate the polysilicon plug into a plurality of discrete polysilicon interconnects, as shown in FIG. 14. In the exemplary case under discussion, a pair of through holes are etched into the polysilicon plug to thereby form three discrete polysilicon interconnects 108, 109' and 109". In a general case, the monolithic polysilicon plug advantageously can be separated into N polysilicon interconnects by etching N–1 through holes into the polysilicon plug, where is a positive integer greater than or equal to two. Preferably, the polysilicon etch is anisotropic etch; most preferably, the polysilicon etch is a plasma-enhanced chloride dry etch, e.g., chlorine ($CL_2$) and hydrogen bromide (HBr). Additional details regarding the etch process are disclosed in U.S. Pat. No. 5,259,924, which patent is incorporated herein by reference.

During step S8, the through holes formed in the polysilicon etching step are filed with a dielectric, e.g., BPSG. It will be appreciated that other materials advantageously can be employed; the deposited material depending on the additional structure(s) to be fabricated on the newly formed polysilicon interconnects. Step S9 generally denotes that additional steps are then performed to fabricate additional structures, e.g., the capacitors 110', 110" and digitline D1 illustrated in FIG. 6

To summarize the discussion above, the present invention provides a process for forming N polysilicon interconnects in a semiconductor device, where N is a positive integer greater than or equal to two. Preferably, the process includes steps for depositing a monolithic polysilicon plug covering N contact openings, and etching N–1 through holes in the polysilicon plug to thereby separate the polysilicon plug into N polysilicon interconnects.

More specifically, the present invention provides a process for forming a plurality of polysilicon interconnects associated with a respective plurality of contact openings in a semiconductor device. Preferably, the process includes steps of providing a workpiece having an active area 102 and a plurality of potential contact openings covered with a dielectric layer 120, etching a first through hole in the dielectric layer to expose the plurality of contact openings, depositing a polysilicon plug 122 in the first through hole, and etching at least one second through hole, e.g., hole 124' of FIG. 14, in the polysilicon plug 122 to thereby divide the polysilicon plug into the polysilicon interconnects, e.g., interconnects 108 and 109' of FIG. 14.

Stated another way, the present invention provides a semiconductor processing method for forming N polysilicon interconnects coupled to N contact openings in a semiconductor device. The semiconductor processing method advantageously includes steps of providing a workpiece having an active area and N potential contact openings covered with a dielectric layer, etching a first through hole in the dielectric layer to expose substantially all of the workpiece corresponding to the active area to thereby expose the N contact openings, depositing a monolithic polysilicon plug in the first through hole, arid etching N−1 second through holes in the polysilicon plug and disposed between the N contact openings to thereby divide the polysilicon plug into the N polysilicon interconnects, where N is an integer greater than or equal to 2. According to one aspect of the inventive processing method, the workpiece includes N−1 conductors traversing the active area, the N contact openings are disposed adjacent to the N−1 conductors, and each of the N contact openings is separated from the other contact openings by one of the N−1 conductors. In an exemplary case, the conductors are wordlines.

Furthermore, the present invention provides a semiconductor processing method for forming N polysilicon interconnects coupled to N contact openings in a semiconductor device, including steps for providing a workpiece having an active area and N potential contact openings covered with first and second dielectric layers, etching a first hole in the first dielectric layer over substantially all of the workpiece corresponding to the active area using a first etch process, etching a first through hole in the first and second dielectric layers to expose substantially all of the workpiece corresponding to the active area to thereby expose the N contact openings using a second etch process, depositing a monolithic polysilicon plug in the first through hole, and etching, using a third etch process, N−1 second through holes in the polysilicon plug and disposed between the N contact openings to thereby divide the polysilicon plug into the N polysilicon interconnects, where N is an integer greater than or equal to 2.

It will be appreciated that the present invention also provides a semiconductor processing method which can be employed in forming M×N polysilicon interconnects coupled to M×N contact openings in a semiconductor array including at least M discrete devices. In one exemplary case, the semiconductor array is a memory device, e.g., a DRAM; other devices including semiconductor arrays advantageously can be formed. Preferably, the processing method includes steps of providing a workpiece having M active areas (see FIG. 7), each active area having N potential contact openings covered with first and second dielectric layers, etching M first holes in the first dielectric layer over substantially all of the workpiece corresponding to the M active areas using a first etch process, etching M first through holes in the first and second dielectric layers to expose substantially all of the workpiece corresponding to the M active areas to thereby expose the M×N contact openings using a second etch process, depositing a monolithic polysilicon plug in the M first through holes to thereby form M polysilicon plugs, and etching, using a third etch process, M×(N−1) second through holes in the M polysilicon plugs to thereby divide the M polysilicon plugs into the M×N polysilicon interconnects. In an exemplary case; N is an integer greater than or equal to 2 and M is an integer orders of magnitude greater than N.

Furthermore, the present invention provides a semiconductor processing method for forming N polysilicon interconnects coupled to N contact openings in a semiconductor device, comprising steps for providing a workpiece having an active area and N potential contact openings covered with a dielectric layer, etching a first through hole, depositing a monolithic polysilicon plug in the first through hole, and etching N−1 second through holes in the polysilicon plug and disposed between the N contact openings to thereby divide the polysilicon plug into the N polysilicon interconnects. Preferably, the first through hole has first and second dimensions sized to open a through hole in the dielectric layer of sufficient size to expose substantially all of the workpiece corresponding to the active area to thereby expose the N contact openings. In addition, the N−1 through holes each have respective third and fourth dimensions. In one exemplary embodiment of the present invention, N is an integer greater than or equal to 2, the first dimension is greater than the second dimension, the second dimension of the first through hole is aligned with the short axis of the active area, the third dimension is greater than the fourth dimension, and the fourth dimension of each of the N−1 second through holes is aligned with a predetermined portion of the active area perpendicular to the long axis of the active area.

From the discussion above, it will be appreciated that the present invention provides a semiconductor processing method for forming N polysilicon interconnects coupled to N contact openings in a semiconductor device. Preferably, this method includes steps for providing a workpiece having an active area and N potential contact openings covered with first and second dielectric layers, etching a first hole having first and second dimensions in the first dielectric layer over substantially all of the workpiece corresponding to the active area using a first etch process, etching a first through hole have the first and the second dimensions in the second dielectric layer to expose substantially all of the workpiece corresponding to the active area to thereby expose the N contact openings using a second etch process, depositing a monolithic polysilicon plug in the first through hole, and etching, using a third etch process, N−1 second through holes, each having third and fourth dimensions, in the polysilicon plug and disposed between the N contact openings to thereby divide the polysilicon plug into the N polysilicon interconnects. In one exemplary embodiment, N is an integer greater than or equal to 2, the first dimension is greater than the second dimension, the second dimension of the first through hole is aligned with the short axis of the active area, the third dimension is greater than the fourth dimension, and the fourth dimension of each of the N−1 second through holes is aligned with a predetermined portion of the active area perpendicular to the long axis of the active area.

In addition, it will be appreciated that the present invention advantageously includes, but is not limited to, a semiconductor processing method for forming a pair of memory cells connected to a common digitline, wherein an active area corresponding to the memory cells includes 3 contact openings permitting connection of first and second storage capacitors and the common digitline via 3 polysilicon interconnects coupled to 3 contact openings in a semiconductor device. In one exemplary embodiment, the method includes steps for providing a workpiece having an active area and 3 potential contact openings covered with a dielectric layer, etching a first through hole in the dielectric layer to expose substantially all of the workpiece corresponding to the active area to thereby expose the 3 contact openings, depositing a monolithic polysilicon plug in the first through hole, and etching 2 second through holes in the polysilicon plug and disposed between the 3 contact openings to thereby divide the polysilicon plug into the 3 polysilicon interconnects.

Stated another way, a pair of memory cells connected to a common digitline, wherein an active area corresponding to the memory cells includes 3 contact openings permitting connection of first and second storage capacitors and the common digitline via 3 polysilicon interconnects coupled to 3 contact openings can be fabricated by a method steps for providing a workpiece having an active area and 3 potential contact openings covered with first and second dielectric layers, etching a first hole in the first dielectric layer over substantially all of the workpiece corresponding to the active area using a first etch process, etching a first through hole in the first and second dielectric layers to expose substantially all of the workpiece corresponding to the active area to thereby expose the 3 contact openings using a second etch process, depositing a monolithic polysilicon plug in the first through hole, and etching, using a third etch process, 2 second through holes in the polysilicon plug and disposed between the 3 contact openings to thereby divide the polysilicon plug into the 3 polysilicon interconnects.

The method discussed immediately above advantageously can be scale up to facilitate fabrication of a memory cell array of M elements, each element of the array including a pair of memory cells connected to a common digitline, wherein an active area corresponding to each pair of memory cells includes 3 contact openings permitting connection of first and second storage capacitors and the common digitline via 3 polysilicon interconnects coupled to 3 contact openings to thereby forming 3M polysilicon interconnects coupled to 3M contact openings. Preferably, the semiconductor proceeding method includes steps for providing a workpiece having M active areas, each active area having 3 potential contact openings covered with first and second dielectric layers, etching M first holes in the first dielectric layer over substantially all of the workpiece corresponding to the M active areas using a first etch process, etching M first through holes in the first and second dielectric layers to expose substantially all of the workpiece corresponding to the M active areas to thereby expose the 3M contact openings using a second etch process, depositing a monolithic polysilicon plug in the M first through holes to thereby form M polysilicon plugs, and etching, using a third etch process, 2M second through holes in the M polysilicon plugs to thereby divide the M polysilicon plugs into the 3M polysilicon interconnects. In an exemplary case, M is an integer greater than 1000, although M advantageously can be several orders of magnitude larger than 1000.

Figure 15:
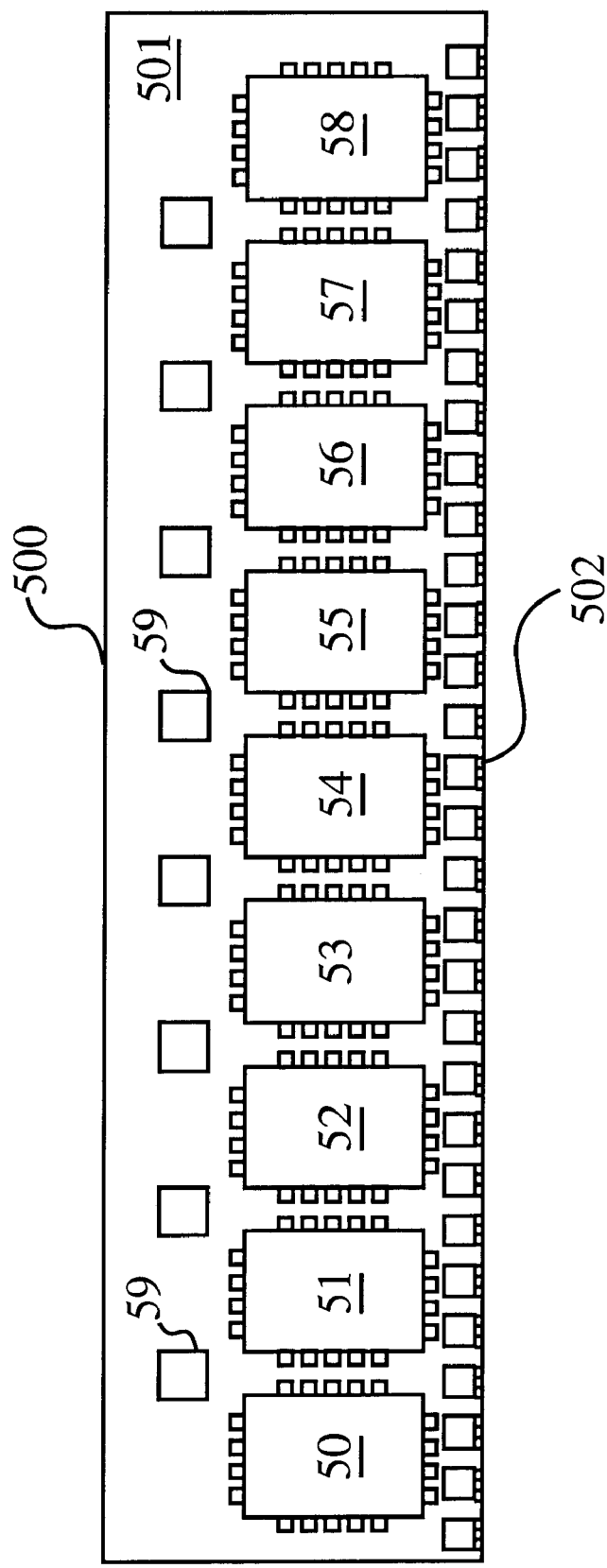
FIG. 15 is a plan view of a memory module having memory chips constructed according to the present invention.

FIG. 15 is plan view of a memory module 500 having memory chips 50–58 including semiconductor memory devices constructed in accordance with the present invention. That is, chips 50–58 have a DRAM cell such as described in connection with FIGS. 5 and 6. Memory module 500 is a SIMM (single in line memory module) having nine memory chips (IC's) 50–58 aligned on one side of a printed circuit board substrate. The number of such memory chips in the SIMM typically will vary between 3 to 9. The circuit board 501 has an edge connector 502 along one longitudinal edge to permit it to plug into a memory socket on a computer motherboard of conventional design (not shown). A wiring pattern (not shown), which can be a conventionally known design for this purpose, is formed on the board 501 and connects the terminals or leads shown comprising the edge connector 502 to the memory chips 50–58. Small ceramic decoupling capacitors 59 are also mounted on substrate 501 to suppress transient voltage spikes. Other than the memory device structures formed in accordance with the inventive method and used in memory chips 50–58, the general layout of the SIMM 500 can be a conventional construction. Each of the memory chip 50–58 may be fabricated in accordance with the teachings of the present invention.

Stated another way, the present invention can be employed in fabricating a memory module, comprising a die substrate including a circuit board, a plurality of memory chips mounted on the circuit board, wherein one or more of the memory chips comprise a memory circuit fabricated on the semiconductor chip for communicating with a processor, where the memory circuit advantageously includes an active area 102, N elements D1, etc., disposed above the active area 102 and separated from the active area 102 by at least one dielectric layer 120, and N vertical polysilicon interconnects, e.g., interconnects 108, 109', and 109" in FIG. 14, electrically connecting N contact openings associated with the active area 102 with the N elements. According to one aspect of the invention, the N polysilicon interconnects are formed by the process of providing a workpiece having the active area 102 and N potential contact openings covered with the dielectric layer 120, etching a first through hole in the dielectric layer to expose substantially all of the workpiece corresponding to the active area 102 to thereby expose the N contact openings, depositing a monolithic polysilicon plug 122 in the first through hole, and etching N−1 second through holes, e.g., holes 124', 124" in FIG. 14, in the polysilicon plug and disposed between the N contact openings to thereby divide the polysilicon plug into the N polysilicon interconnects, where N is an integer greater than or equal to 2.

Figure 16:
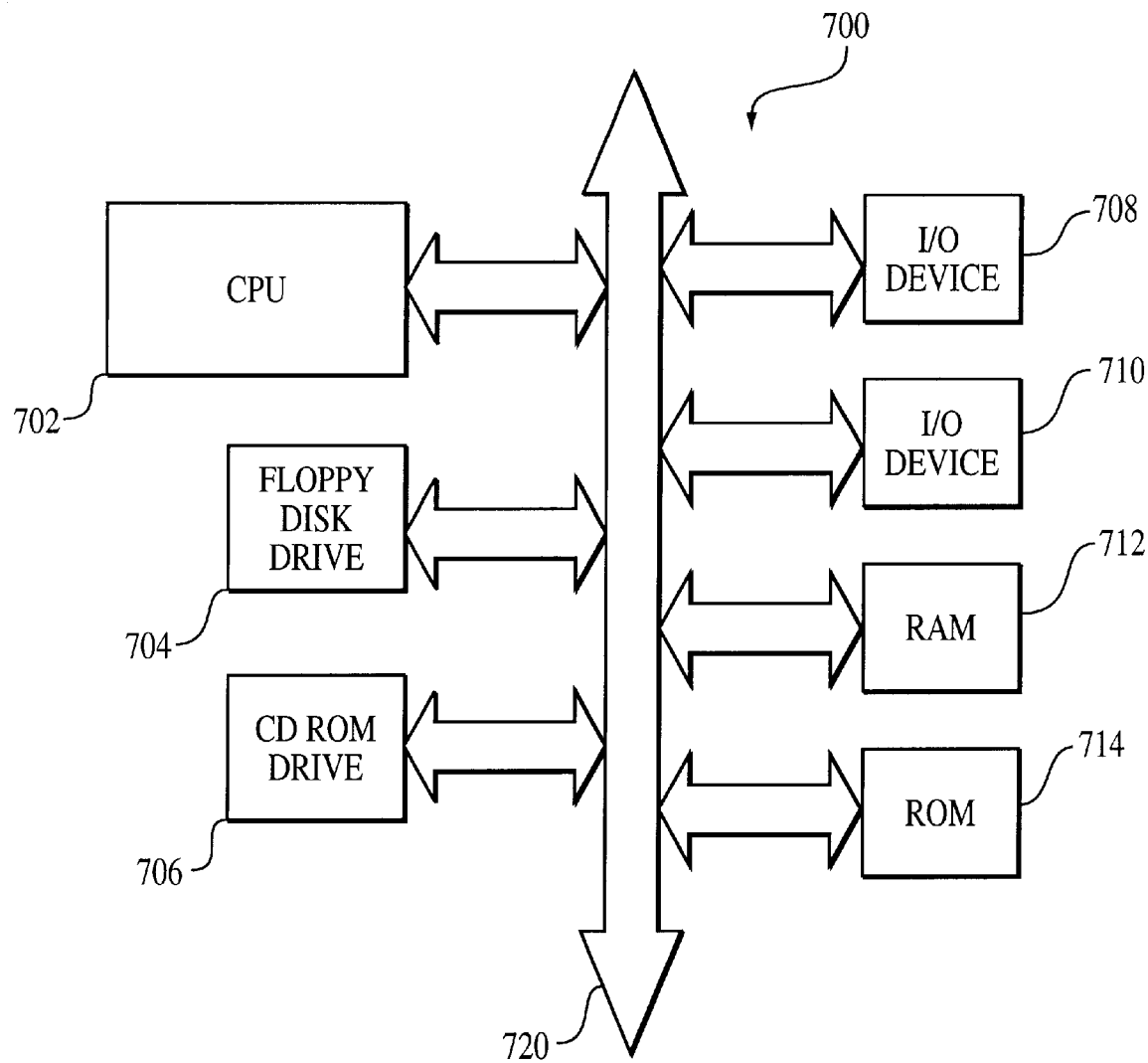
FIG. 16 is a high level block diagram of a processor based system employing RAM including memory chips constructed according to the present invention.

FIG. 16 is a block diagram of a processor-based system 700 using RAM 712 constructed in accordance with the present invention. That is, RAM 712 uses a DRAM cell such as described in connection with FIGS. 5–8. The processor-based system 700 may be a computer system, a process control system or any other system employing a processor and associated memory. The system 700 includes a central processing unit (CPU) 702, e.g., a microprocessor, that communicates with the RAM 712 and an I/O device 708 over a bus 720. It must be noted that the bus 720 may be a series of buses and bridges commonly used in a processor-base system, but for convenience purposes only, the bus 720 has been illustrated as a single bus. A second I/O device 710 is illustrated, but is not necessary to practice the invention. The processor-based system 700 also includes read-only memory (ROM) 714, and may include peripheral devices such as a floppy disk drive 704 and a compact disk (CD) ROM drive 705 that also communicates with the CPU 702 over the bus 720, as is well known in the art. The RAM memory may be advantageously fabricated in accordance with the teachings of the invention.

In other words, the present invention includes a processor system 700 fabricated from a processor 702, and memory circuit 712/714, which can be disposed on a semiconductor chip communicating with the processor via bus 720. Preferably, the memory circuit 712/714 includes an active area, N elements disposed above the active area and separated from the active area by at least one dielectric layer, and N vertical polysilicon interconnects electrically connecting N contact openings associated with the active area with the N elements, as depicted in FIG. 6. Most preferably, the N polysilicon interconnects are formed by the process of providing a workpiece having the active area 102 and N potential contact openings covered with the dielectric layer 120, etching a first through hole in the dielectric layer to expose substantially all of the workpiece corresponding to the active area to thereby expose the N contact openings, depositing a monolithic polysilicon plug 122 in the first through hole, and etching N−1 second through holes, e.g., 124', 124" in FIG. 14, in the polysilicon plug 122 and disposed between the N contact openings to thereby divide the polysilicon plug into the N polysilicon interconnects, e.g., interconnects 108, 109', and 109" of FIG. 14, where N is an integer greater than or equal to 2.

Figure 17A:
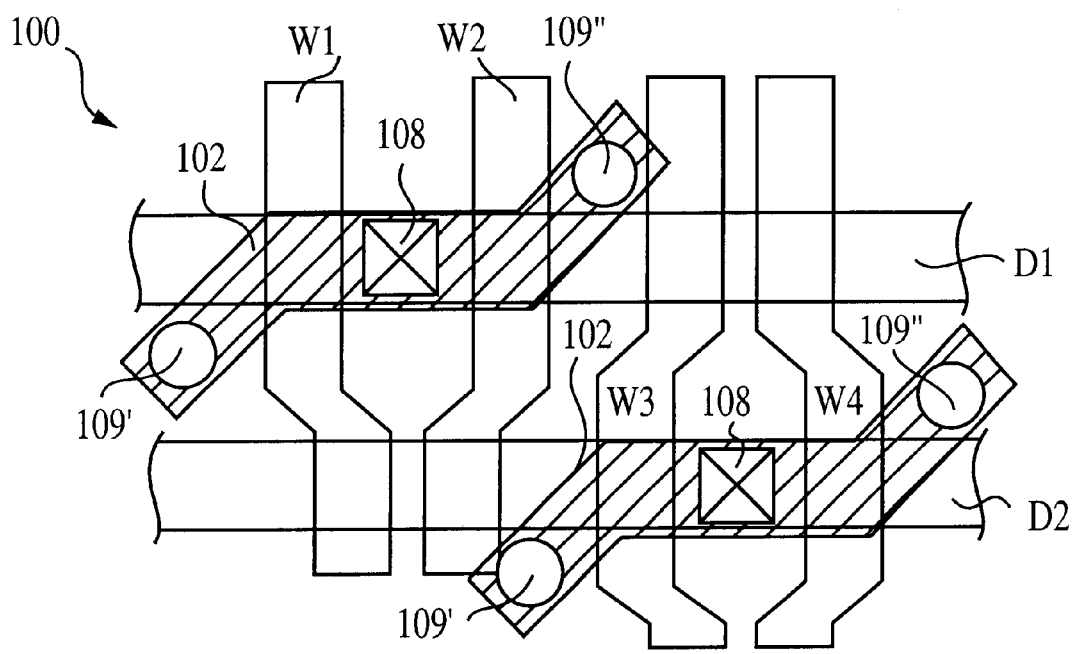
FIGS. 17A and 17B are top and sectional views, respectively, of a buried digitline semiconductor device which can be fabricated by employing the method according to the present invention.
Figure 17B:
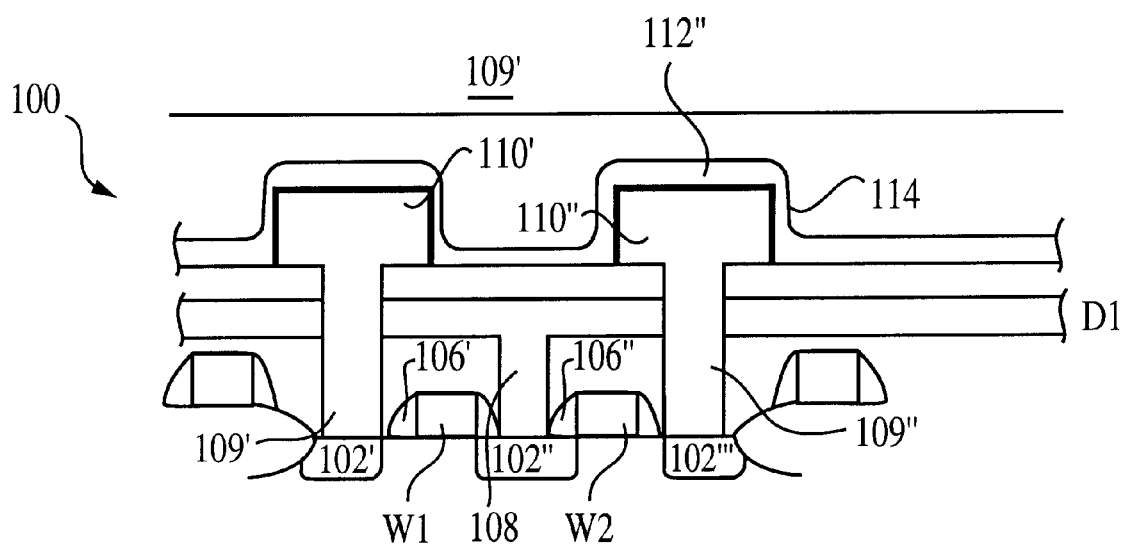

While the inventive method of fabricating polysilicon interconnects according to the present invention has been explained with respect to buried capacitor memory cells, the present invention is not so limited. For example, the buried digitline memory cells illustrated in FIGS. 17A and 17B advantageously can be formed by employing the inventive method. It should be mentioned that while the shape of the active area 102 and the disposition of the interconnects 108, 109' and 109" are different from that depicted in FIG. 5, since the actual construction and materials are substantially identical, a detailed discussion of FIG. 17(*a*) will be omitted. Moreover, since the major difference between the structures illustrated in FIGS. 6 and 17(*b*) is the relative placement of the digitline D1 with respect to the capacitors 110', 110", and since the identical numbers are used in both figures, a detailed discussion of FIG. 17(*b*) will also be omitted. It will also be appreciated that other semiconductor devices advantageously can be formed in accordance with the present invention, provided that these devices include clusters of relatively closely spaced contact openings.

Figure 18A:
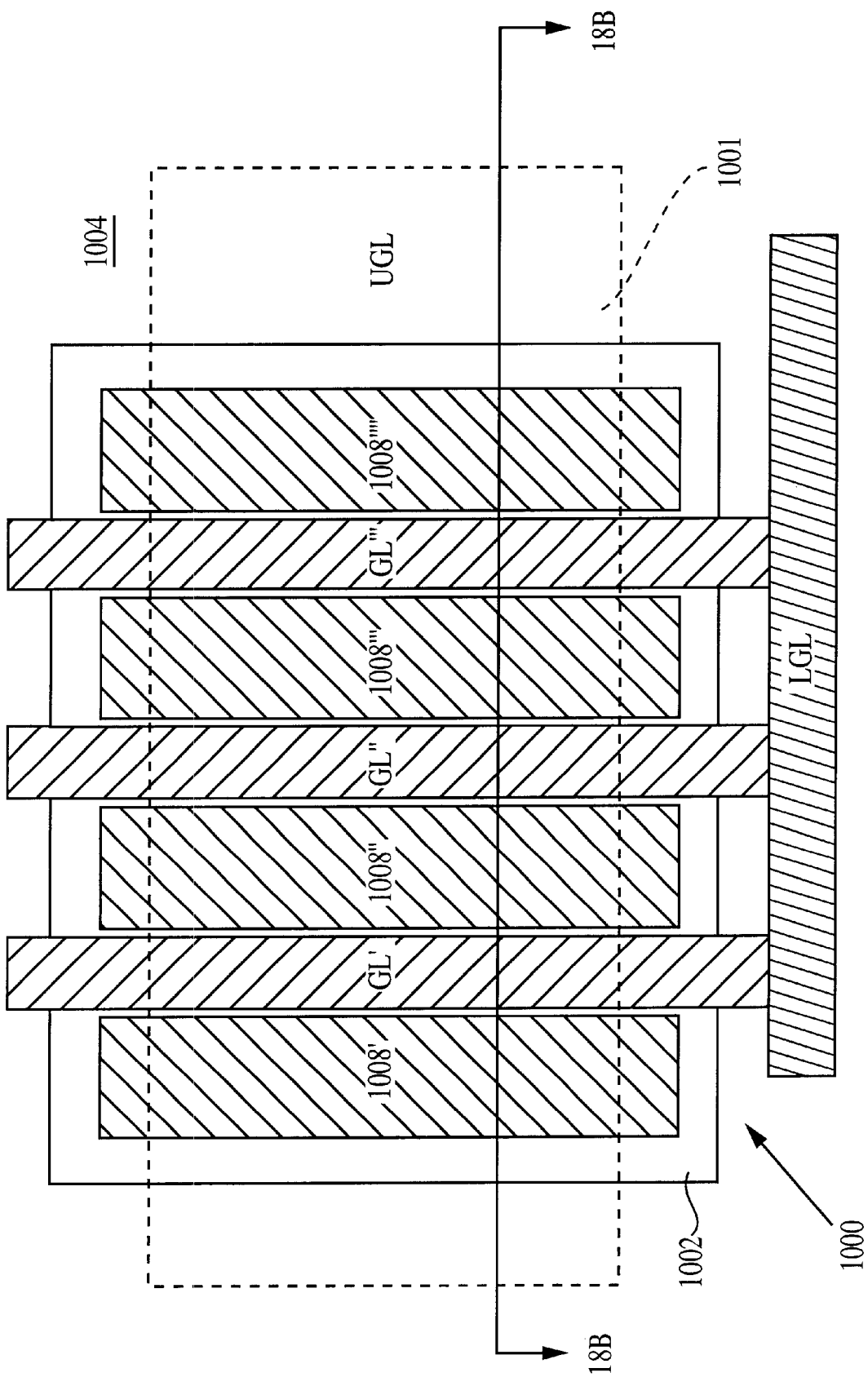
FIGS. 18A and 18B depict top and side sectional views, respectively, of a peripheral portion of a semiconductor wafer fragment constructed according to the present invention.
Figure 18B:
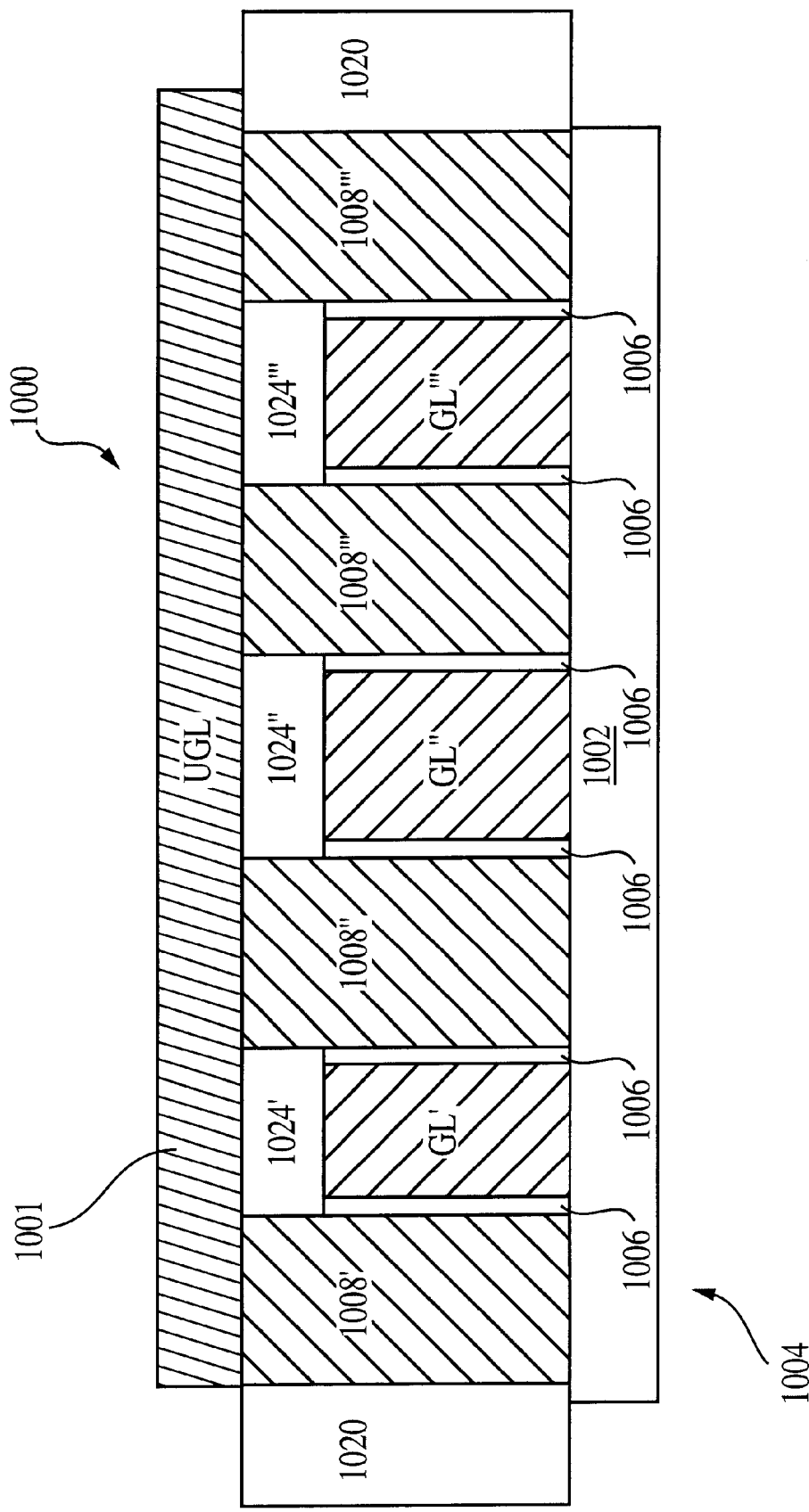

For example, it will be appreciated from the discussion above that other devices such as peripheral devices can be fabricated in accordance with the present invention. FIGS. 18A and 18B are top and sectional views of a peripheral portion of a semiconductor wafer fragment 1000 including selected layers of a discrete circuit element 1001. The semiconductor wafer fragment 1000 includes an active area 1002 formed in a substrate 1004. Above the active area 1002 is disposed a plurality of gate lines GL', GL", and GL'". Preferably, each gate line GL is formed from a conductor over an oxide layer and nitride spacers 1006' and 1006". All of the gate lines GL', GL", and GL'" advantageously can be connected to a lower gate line LGL.

The active area 1002 is connected via four contact openings to an upper gate line UGL by polysilicon interconnects 1008', 1008", 1008'", and 1008"", formed using the method described above with respect to FIG. 9. Thus, the polysilicon interconnects 1008', 1008", 1008'", and 1008"" are disposed in a primary through hole in a dielectric layer 1020, wherein the polysilicon interconnects 1008', 1008", 1008'" and 1008"" are separated by adjacent gate lines GL', GL", and GL'". In the exemplary case illustrated in FIG. 18B, the polysilicon interconnects 1008', 1008", 1008'", and 1008"" are further isolated from one another by insulating material deposited in secondary through holes 1024', 1024", and 1024"".

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

What is claimed is:

1. A process for forming N polysilicon interconnects in a semiconductor device, where N is a positive integer greater than or equal to two, comprising:

depositing a monolithic polysilicon plug covering N contact openings; and etching N−1 through holes in the polysilicon plug to thereby separate the polysilicon plug into N polysilicon interconnects.

2. The process as recited in claim 1, wherein N is equal to three.

3. A process for forming a plurality of polysilicon interconnects associated with a respective plurality of contact openings in a semiconductor device, comprising:

etching a first through hole in a dielectric layer of a workpiece having an active area and a plurality of potential contact openings covered with the dielectric layer to thereby expose the plurality of contact openings;

depositing a polysilicon plug in the first through hole; and etching at least one second through hole in the polysilicon plug to thereby divide the polysilicon plug into the polysilicon interconnects.

4. The process as recited in claim 3, wherein the semiconductor device is a memory, and wherein the active area corresponds to a pair of memory cells in the memory.

5. The process as recited in claim 3, wherein the workpiece further comprises first and second dielectric layers, and wherein the etching of the first through hole is performed by employing first and second etching processes.

6. The process as recited in claim 3, wherein the workpiece further comprises a conductor traversing the active area, and wherein the contact openings are disposed adjacent to the conductor.

7. The process as recited in claim 6, wherein the conductor is a wordline.

8. The process as recited in claim 6, wherein the conductor is a wordline, and wherein the contact openings are disposed on opposite sides of the wordline.

9. A semiconductor processing method for forming N polysilicon interconnects coupled to N contact openings in a semiconductor device, comprising:

etching a first through hole in a dielectric layer of a workpiece having an active area and N potential contact openings covered with the dielectric layer to expose substantially all of the workpiece corresponding to the active area to thereby expose the N contact openings;

depositing a monolithic polysilicon plug in the first through hole; and etching N−1 second through holes in the polysilicon plug and disposed between the N contact openings to thereby divide the polysilicon plug into the N polysilicon interconnects, where N is an integer greater than or equal to 2.

10. The semiconductor processing method as recited in claim 9, wherein the workpiece further comprises first and second dielectric layers, and wherein the etching of the first through hole is performed by employing first and second etching processes.

11. The semiconductor processing method as recited in claim 9, wherein:
the workpiece further comprises N−1 conductors traversing the active area;
the N contact openings are disposed adjacent to the N−1 conductors; and
each of the N contact openings is separated from the other contact openings by one of the N−1 conductors.

12. The semiconductor processing method as recited in claim 11, wherein the N−1 conductors are wordlines.

13. A semiconductor processing method for forming N polysilicon interconnects coupled to N contact openings in a semiconductor device, comprising:
providing a workpiece having an active area and N potential contact openings covered with first and second dielectric layers;
etching a first hole in the first dielectric layer over substantially all of the workpiece corresponding to the active area using a first etch process;
etching a first through hole in the first and second dielectric layers to expose substantially all of the workpiece corresponding to the active area to thereby expose the N contact openings using a second etch process;
depositing a monolithic polysilicon plug in the first through hole; and
etching, using a third etch process, N−1 second through holes in the polysilicon plug and disposed between the N contact openings to thereby divide the polysilicon plug into the N polysilicon interconnects,
where N is an integer greater than or equal to 2.

14. The semiconductor processing method as recited in claim 13, wherein:
the workpiece further comprises N−1 conductors traversing the active area;
the N contact openings are disposed adjacent to the N−1 conductors; and
each of the N contact openings is separated from the other contact openings by one of the N−1 conductors.

15. The semiconductor processing method as recited in claim 14, wherein the N−1 conductors are wordlines.

16. A semiconductor processing method for forming M×N polysilicon interconnects coupled to M×N contact openings in a semiconductor array including at least M discrete devices, comprising:
providing a workpiece having M active areas, each active area having N potential contact openings covered with first and second dielectric layers;
etching M first holes in the first dielectric layer over substantially all of the workpiece corresponding to the M active areas using a first etch process;
etching M first through holes in the second dielectric layer to expose substantially all of the workpiece corresponding to the M active areas to thereby expose the M×N contact openings using a second etch process;
depositing a monolithic polysilicon plug in the M first through holes to thereby form M polysilicon plugs; and
etching using a third etch process, M×(N−1) second through holes in the M polysilicon plugs to thereby divide the M polysilicon plugs into the M×N polysilicon interconnects,
where N is an integer greater than or equal to 2 and M is an integer orders of magnitude greater than N.

17. The semiconductor processing method as recited in claim 16, wherein:
the workpiece further comprises M×(N−1) conductors traversing the M active areas;
the M×N contact openings are disposed adjacent to the M×(N−1) conductors; and
each of the N contact openings is separated from the other N contact openings associated with one of the M active areas by one of the N−1 conductors.

18. The semiconductor processing method as recited in claim 17, wherein the M×N−1 conductors are wordlines.

19. A semiconductor processing method for forming N polysilicon interconnects coupled to N contact openings in a semiconductor device, comprising:
etching a first through hole having first and second dimensions in a dielectric layer of a workpiece having an active area and N potential contact openings covered with the dielectric layer to expose substantially all of the workpiece corresponding to the active area to thereby expose the N contact openings;
depositing a monolithic polysilicon plug in the first through hole; and
etching N−1 second through holes each having third and fourth dimensions in the polysilicon plug and disposed between the N contact openings to thereby divide the polysilicon plug into the N polysilicon interconnects,
wherein:
N is an integer greater than or equal to 2;
the first dimension is greater than the second dimension;
the second dimension of the first through hole is aligned with the short axis of the active area;
the third dimension is greater than the fourth dimension; and
the fourth dimension of each of the N−1 second through holes is aligned with a portion of the active area perpendicular to the long axis of the active area.

20. The semiconductor processing method as recited in claim 19, wherein the workpiece further comprises first and second dielectric layers, and wherein the etching of the first through hole is performed by employing first and second etching processes.

21. The semiconductor processing method as recited in claim 19, wherein:
the workpiece further comprises N−1 conductors traversing the active area;
the N contact openings are disposed adjacent to the N−1 conductors;
each of the N contact openings is separated from the other contact openings by one of the N−1 conductors; and
each of the predetermined portions corresponds to one of the N−1 conductors.

22. The semiconductor processing method as recited in claim 21, wherein the N−1 conductors are wordlines.

23. A semiconductor processing method for forming N polysilicon interconnects coupled to N contact openings in a semiconductor device, comprising:
etching a first hole having first and second dimensions in a first dielectric layer of a workpiece having an active area and N potential contact openings covered with first and second dielectric layers over substantially all of the workpiece corresponding to the active area using a first etch process;
etching a first through hole having the first and the second dimensions in the first and second dielectric layers to expose substantially all of the workpiece corresponding to the active area to thereby expose the N contact openings using a second etch process;

depositing a monolithic polysilicon plug in the first through hole; and etching, using a third etch process, N−1 second through holes, each having third and fourth dimensions, in the polysilicon plug and disposed between the N contact openings to thereby divide the polysilicon plug into the N polysilicon interconnects, wherein:
N is an integer greater than or equal to 2;
the first dimension is greater than the second dimension;
the second dimension of the first through hole is aligned with the short axis of the active area;
the third dimension is greater than the fourth dimension; and
the fourth dimension of each of the N−1 second through holes is aligned with a predetermined portion of the active area perpendicular to the long axis of the active area.

24. The semiconductor processing method as recited in claim 23, wherein:
the workpiece further comprises N−1 conductors traversing the active area;
the N contact openings are disposed adjacent to the N−1 conductors; and
each of the N contact openings is separated from the other contact openings by one of the N−1 conductors; and
each of the predetermined portions corresponds to one of the N−1 conductors.

25. The semiconductor processing method as recited in claim 24, wherein the N−1 conductors are wordlines.

26. A semiconductor processing method for forming a pair of memory cells connected to a common digitline, wherein an active area corresponding to the memory cells includes 3 contact openings permitting connection of first and second storage capacitors and the common digitline via 3 polysilicon interconnects coupled to 3 contact openings in a semiconductor device, comprising:
providing a workpiece having an active area and 3 potential contact openings covered with a dielectric layer;
etching a first through hole in the dielectric layer to expose substantially all of the workpiece corresponding to the active area to thereby expose the 3 contact openings;
depositing a monolithic polysilicon plug in the first through hole; and
etching 2 second through holes in the polysilicon plug and disposed between the 3 contact openings to thereby divide the polysilicon plug into the 3 polysilicon interconnects.

27. The semiconductor processing method as recited in claim 26, wherein the workpiece further comprises first and second dielectric layers, and wherein the etching of the first through hole is performed by employing first and second etching processes.

28. The semiconductor processing method as recited in claim 26, wherein:
the workpiece further comprises 2 conductors traversing the active area, each of the conductors being associated with one of the memory cells;
the 3 contact openings are disposed adjacent to the 2 conductors; and each of the 3 contact openings is separated from the other contact openings by one of the conductors.

29. The semiconductor processing method as recited in claim 28, wherein the conductors are wordlines.

30. A semiconductor processing method for forming a pair of memory cells connected to a common digitline, wherein an active area corresponding to the memory cells includes 3 contact openings permitting connection of first and second storage capacitors and the common digitline via 3 polysilicon interconnects coupled to 3 contact openings, comprising:
providing a workpiece having an active area and 3 potential contact openings covered with first and second dielectric layers;
etching a first hole in the first dielectric layer over substantially all of the workpiece corresponding to the active area using a first etch process;
etching a first through hole in the second dielectric layers to expose substantially all of the workpiece corresponding to the active area to thereby expose the 3 contact openings using a second etch process;
depositing a monolithic polysilicon plug in the first through hole; and
etching, using a third etch process, 2 second through holes in the polysilicon plug and disposed between the 3 contact openings to thereby divide the polysilicon plug into the 3 polysilicon interconnects.

31. The semiconductor processing method as recited in claim 30, wherein:
the workpiece further comprises 2 conductors traversing the active area;
the 3 contact openings are disposed adjacent to the conductors; and
each of the 3 contact openings is separated from the other contact openings by one of the conductors.

32. The semiconductor processing method as recited in claim 31, wherein the conductors are wordlines.

33. A semiconductor processing method for forming a memory cell array of M elements, each element of the array including a pair of memory cells connected to a common digitline, wherein an active area corresponding to each pair of memory cells includes 3 contact openings permitting connection of first and second storage capacitors and the common digitline via 3 polysilicon interconnects coupled to 3 contact openings to thereby form 3M polysilicon interconnects coupled to 3M contact openings, comprising:
providing a workpiece having M active areas, each active area having 3 potential contact openings covered with first and second dielectric layers;
etching M first holes in the first dielectric layer over substantially all of the workpiece corresponding to the M active areas using a first etch process;
etching M first through holes in the second dielectric layer to expose substantially all of the workpiece corresponding to the M active areas to thereby expose the 3M contact openings using a second etch process;
depositing a monolithic polysilicon plug in the M first through holes to thereby form M polysilicon plugs; and
etching, using a third etch process, 2M second through holes in the M polysilicon plugs to thereby divide the M polysilicon plugs into the 3M polysilicon interconnects,
where M is an integer greater than 1000.

34. The semiconductor processing method as recited in claim 33, wherein:

the workpiece further comprises 2M conductors traversing the M active areas;

the 3M contact openings are disposed adjacent to the 2M conductors; and each one of the contact openings associated with one of the M active areas is separated from the other contact openings associated with one of the M active areas by one of the respective conductors.

35. The semiconductor processing method as recited in claim 33, wherein the 2M conductors are wordlines.

* * * * *